United States Patent
Dong et al.

(10) Patent No.: US 8,198,951 B2
(45) Date of Patent: Jun. 12, 2012

(54) CAPACITIVE ISOLATION CIRCUITRY

(75) Inventors: Zhiwei Dong, Austin, TX (US); Shouli Yan, Austin, TX (US); Axel Thomsen, Austin, TX (US); William W. K. Tang, Austin, TX (US); Ka Y. Leung, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 693 days.

(21) Appl. No.: 12/414,379

(22) Filed: Mar. 30, 2009

(65) Prior Publication Data

US 2009/0213914 A1    Aug. 27, 2009

Related U.S. Application Data

(63) Continuation-in-part of application No. 11/772,178, filed on Jun. 30, 2007, now Pat. No. 8,049,573, which is a continuation-in-part of application No. 11/089,348, filed on Mar. 24, 2005, now Pat. No. 7,302,247, which is a continuation-in-part of application No. 10/860,399, filed on Jun. 3, 2004, now Pat. No. 7,421,028, and a continuation-in-part of application No. 10/860,519, filed on Jun. 3, 2004, now Pat. No. 7,447,492, and a continuation-in-part of application No. 11/020,977, filed on Dec. 22, 2004, now Pat. No. 7,376,212, and a continuation-in-part of application No. 11/064,413, filed on Feb. 23, 2005, now Pat. No. 7,460,604, and a continuation-in-part of application No. 12/060,049, filed on Mar. 31, 2008.

(51) Int. Cl.
*H04B 3/28* (2006.01)
*H01P 5/02* (2006.01)

(52) U.S. Cl. .................. 333/12; 333/5; 375/257
(58) Field of Classification Search ............... 333/1, 5, 333/12; 375/257, 108–112
See application file for complete search history.

(56) References Cited

U.S. PATENT DOCUMENTS
3,058,078 A    10/1962    Hon
(Continued)

FOREIGN PATENT DOCUMENTS
DE    10100282 A1    7/2002
(Continued)

OTHER PUBLICATIONS

Akiyama, Noboru, A High-Voltage Monolithic Isolator for a Communication Network Interface, IEEE Transactions on Electron Devices, May 2002, pp. 895-901, vol. 49, No. 5, in U.S. Appl. No. 10/860,399.

(Continued)

*Primary Examiner* — Dean O Takaoka
*Assistant Examiner* — Alan Wong
(74) *Attorney, Agent, or Firm* — Trop, Pruner & Hu, P.C.

(57) ABSTRACT

An integrated circuit having voltage isolation capabilities includes a plurality of communications channels for transceiving data from the integrated circuit. Each of the communications channel includes capacitive isolation circuitry located in conductive layers of the integrated circuit for providing a high voltage isolation link. The capacitive isolation circuitry distributes a first portion of a high voltage isolation signal across a first group of capacitors on a first link and a second link in the capacitive isolation circuitry and distributes a second portion of the high voltage isolation signal across a second group of capacitors in the first link and the second link in the capacitive isolation circuitry. A differential receiver on each of the plurality of communications channels receives the data on the first link and the second link. A differential transmitter on each of the plurality of communications channels transmits the data on the first link at a selected one of a first phase and a second phase and for transmitting the data on the second link at the selected one of the first phase and the second phase. The second phase is 180 degrees out of phase with the first phase. Each of the differential transmitters controls the selection of the first phase and the second phase on each of the first link and the second link such that only the first phase or the second phase is cross coupled onto a selected communications channel from adjacent communications channels.

20 Claims, 21 Drawing Sheets

U.S. PATENT DOCUMENTS

| | | |
|---|---|---|
| 3,537,022 A | 10/1970 | Regan |
| 3,713,148 A | 1/1973 | Cardullo et al. |
| 3,714,540 A | 1/1973 | Galloway |
| 3,760,198 A | 9/1973 | Mori et al. |
| 3,798,608 A | 3/1974 | Huebner |
| 3,859,624 A | 1/1975 | Kriofsky et al. |
| 4,024,452 A | 5/1977 | Seidel |
| 4,027,152 A | 5/1977 | Brown et al. |
| 4,118,603 A | 10/1978 | Kumhyr |
| 4,227,045 A | 10/1980 | Chelcun et al. |
| 4,302,807 A | 11/1981 | Mentler |
| 4,425,647 A | 1/1984 | Collins et al. |
| 4,459,591 A | 7/1984 | Haubner et al. |
| 4,523,128 A | 6/1985 | Stamm et al. |
| 4,536,715 A | 8/1985 | Basarath et al. |
| 4,538,136 A | 8/1985 | Drabing |
| 4,547,961 A | 10/1985 | Bokil et al. |
| 4,584,708 A | 4/1986 | Eilers et al. |
| 4,650,981 A | 3/1987 | Foletta |
| 4,675,579 A | 6/1987 | Hardy et al. |
| 4,703,283 A | 10/1987 | Samuels |
| 4,748,419 A | 5/1988 | Somerville |
| 4,763,075 A | 8/1988 | Weigert |
| 4,780,795 A | 10/1988 | Meinel |
| 4,785,345 A | 11/1988 | Rawls et al. |
| 4,791,326 A | 12/1988 | Vajdic et al. |
| 4,817,865 A | 4/1989 | Wray |
| 4,818,855 A | 4/1989 | Mongeon et al. |
| 4,825,450 A | 4/1989 | Herzog |
| 4,835,486 A | 5/1989 | Somerville |
| 4,853,654 A | 8/1989 | Sakurai |
| 4,859,877 A | 8/1989 | Cooperman et al. |
| 4,868,647 A | 9/1989 | Uehara et al. |
| 4,885,582 A | 12/1989 | LaBarge et al. |
| 4,922,883 A | 5/1990 | Iwasaki |
| 4,924,210 A | 5/1990 | Matsui et al. |
| 4,931,867 A | 6/1990 | Kikuchi |
| 4,937,468 A | 6/1990 | Shekhawat et al. |
| 4,945,264 A | 7/1990 | Lee et al. |
| 4,959,631 A | 9/1990 | Hasegawa et al. |
| 5,041,780 A | 8/1991 | Rippel |
| 5,057,968 A | 10/1991 | Morrison |
| 5,095,357 A | 3/1992 | Andoh et al. |
| 5,102,040 A | 4/1992 | Harvey |
| 5,128,729 A | 7/1992 | Alonas et al. |
| 5,142,432 A | 8/1992 | Schneider |
| 5,164,621 A | 11/1992 | Miyamoto et al. |
| 5,168,863 A | 12/1992 | Kurtzer |
| 5,204,551 A | 4/1993 | Bjornholt |
| 5,270,882 A | 12/1993 | Jove et al. |
| 5,293,400 A | 3/1994 | Monod et al. |
| 5,369,666 A | 11/1994 | Folwell et al. |
| 5,384,808 A | 1/1995 | Van Brunt et al. |
| 5,396,394 A | 3/1995 | Gee |
| 5,404,545 A | 4/1995 | Melvin |
| 5,418,933 A | 5/1995 | Kimura et al. |
| 5,424,709 A | 6/1995 | Tal |
| 5,434,886 A | 7/1995 | Kazawa et al. |
| 5,442,303 A | 8/1995 | Asada et al. |
| 5,444,740 A | 8/1995 | Mizukami et al. |
| 5,448,469 A | 9/1995 | Rilly et al. |
| 5,467,607 A | 11/1995 | Harvey |
| 5,469,098 A | 11/1995 | Johnson, Jr. |
| 5,484,012 A | 1/1996 | Hiratsuka |
| 5,533,054 A | 7/1996 | DeAndrea et al. |
| 5,539,598 A | 7/1996 | Denison et al. |
| 5,544,120 A | 8/1996 | Kuwagata et al. |
| 5,555,421 A | 9/1996 | Enzinna |
| 5,572,179 A | 11/1996 | Ito et al. |
| 5,588,021 A | 12/1996 | Hunt et al. |
| 5,591,996 A | 1/1997 | Haigh et al. |
| 5,596,466 A | 1/1997 | Ochi |
| 5,615,091 A | 3/1997 | Palatnik |
| 5,615,229 A | 3/1997 | Sharma et al. |
| 5,625,265 A | 4/1997 | Vlahu |
| 5,627,480 A | 5/1997 | Young et al. |
| 5,627,488 A | 5/1997 | Tanzawa et al. |
| 5,650,357 A | 7/1997 | Dobkin et al. |
| 5,654,984 A | 8/1997 | Hershbarger et al. |
| 5,663,672 A | 9/1997 | Nuechterlein |
| 5,701,037 A | 12/1997 | Weber et al. |
| 5,714,938 A | 2/1998 | Schwabl |
| 5,716,323 A | 2/1998 | Lee |
| 5,731,727 A | 3/1998 | Iwamoto et al. |
| 5,731,954 A | 3/1998 | Cheon |
| 5,774,791 A | 6/1998 | Strohallen et al. |
| 5,781,071 A | 7/1998 | Kusunoki |
| 5,781,077 A | 7/1998 | Leitch et al. |
| 5,786,763 A | 7/1998 | Canipe |
| 5,786,979 A | 7/1998 | Douglas |
| 5,789,960 A | 8/1998 | Bower |
| 5,801,602 A | 9/1998 | Fawal et al. |
| 5,812,597 A | 9/1998 | Graham et al. |
| 5,812,598 A | 9/1998 | Sharma et al. |
| 5,825,259 A | 10/1998 | Harpham et al. |
| 5,831,426 A | 11/1998 | Black, Jr. et al. |
| 5,831,525 A | 11/1998 | Harvey |
| 5,845,190 A | 12/1998 | Bushue et al. |
| 5,850,436 A | 12/1998 | Rosen et al. |
| 5,864,607 A | 1/1999 | Rosen et al. |
| 5,900,683 A | 5/1999 | Rinehart et al. |
| 5,907,481 A | 5/1999 | Svardsjo |
| 5,913,817 A | 6/1999 | Lee |
| 5,926,358 A | 7/1999 | Dobkin et al. |
| 5,945,728 A | 8/1999 | Dobkin et al. |
| 5,952,849 A | 9/1999 | Haigh |
| 5,969,590 A | 10/1999 | Gutierrez |
| 6,049,258 A | 4/2000 | Fawal et al. |
| 6,054,780 A | 4/2000 | Haigh et al. |
| 6,061,009 A | 5/2000 | Krone et al. |
| 6,069,802 A | 5/2000 | Priegnitz |
| 6,082,744 A | 7/2000 | Allinger et al. |
| 6,087,882 A | 7/2000 | Chen et al. |
| 6,104,003 A | 8/2000 | Jones |
| 6,114,937 A | 9/2000 | Burghartz et al. |
| 6,124,756 A | 9/2000 | Yaklin et al. |
| 6,137,372 A | 10/2000 | Welland |
| 6,222,922 B1 | 4/2001 | Scott et al. |
| 6,232,902 B1 | 5/2001 | Wada |
| 6,249,171 B1 | 6/2001 | Yaklin et al. |
| 6,262,600 B1 | 7/2001 | Haigh et al. |
| 6,291,907 B1 | 9/2001 | Haigh et al. |
| 6,307,497 B1 | 10/2001 | Leung et al. |
| 6,384,763 B1 | 5/2002 | Leung et al. |
| 6,389,063 B1 | 5/2002 | Kanekawa et al. |
| 6,452,519 B1 | 9/2002 | Swanson |
| 6,525,566 B2 | 2/2003 | Haigh et al. |
| 6,538,136 B1 | 3/2003 | Rizzo et al. |
| 6,603,807 B1 | 8/2003 | Yukutake et al. |
| 6,611,051 B2 | 8/2003 | Akiyama et al. |
| 6,670,861 B1 | 12/2003 | Balboni |
| 6,720,816 B2 | 4/2004 | Strzalkowski |
| 6,728,320 B1 | 4/2004 | Khasnis et al. |
| 6,747,522 B2 | 6/2004 | Pietruszynski et al. |
| 6,833,800 B1 | 12/2004 | Patterson |
| 6,873,065 B2 | 3/2005 | Haigh et al. |
| 6,902,967 B2 | 6/2005 | Beasom |
| 6,903,578 B2 | 6/2005 | Haigh et al. |
| 6,914,547 B1 | 7/2005 | Swaroop et al. |
| 6,922,080 B2 | 7/2005 | Haigh et al. |
| 6,927,662 B2 | 8/2005 | Kahlmann et al. |
| 6,940,445 B2 | 9/2005 | Kearney |
| 6,956,727 B1 | 10/2005 | Brokaw |
| 6,967,513 B1 | 11/2005 | Balboni |
| 6,977,522 B1 | 12/2005 | Murabayashi et al. |
| 7,012,388 B2 | 3/2006 | Lin et al. |
| 7,016,490 B2 | 3/2006 | Beutler et al. |
| 7,023,372 B1 | 4/2006 | Singh et al. |
| 7,053,807 B1 | 5/2006 | Gaalaas |
| 7,053,831 B2 | 5/2006 | Dempsey et al. |
| 7,057,491 B2 | 6/2006 | Dempsey |
| 7,075,329 B2 | 7/2006 | Chen et al. |
| 7,102,388 B2 | 9/2006 | Murabayashi et al. |
| 7,277,491 B2 | 10/2007 | Dong et al. |
| 7,315,592 B2 | 1/2008 | Tsatsanis et al. |

| | | | |
|---|---|---|---|
| 7,483,688 B2 * | 1/2009 | Huang et al. | 455/402 |
| 7,609,125 B2 * | 10/2009 | van Quach et al. | 333/5 |
| 7,656,956 B2 * | 2/2010 | King | 375/257 |

FOREIGN PATENT DOCUMENTS

| | | |
|---|---|---|
| FR | 2679670 A1 | 1/1993 |
| GB | 2173956 A1 | 10/1986 |
| JP | 57-132460 A1 | 1/1982 |
| JP | 7-44514 | 5/1995 |
| JP | 2000-174666 | 6/2000 |
| WO | WO99/21332 A1 | 4/1999 |
| WO | 03/050376 | 6/2003 |

OTHER PUBLICATIONS

Baker, Bonnie C., The Basics of Isolation Circuits, Sensors and Systems, May 1996, pp. 46-47.

Bindra, Ashok, MEMS-Based Magnetic Coils Exceed the Limitations of Optical Couplers, Electronic Design, Jul. 24, 2000, p. 43, in U.S. Appl. No. 10/860,399.

Bourgeois, J.M., "PCB-based Transformer for Power MOSFET Drive," 0-7803-1456-5-94 at pp. 283-244, IEEE, 1994, in U.S. Appl. No. 11/772,178.

Choina, Simon, Planar Transformers Make Maximum Use of Precious Board Space, Electronic Design, Mar. 9, 1999, pp. 97 & 99.

Hoskins, Kevin, Isolated ADC Reduces Power Consumption, EDN, Mar. 30, 1995, pp. 73-74, in U.S. Appl. No. 10/860,399.

Ichio Aoki et al.; Fully Integrated CMOS Power Amplifier Design Using the Distributed Active-Transformer Architecture; IEEE Journal of Solid State Circuits, vol. 37, No. 3, Mar. 2002; pp. 371-383, in U.S. Appl. No. 11/772,178.

IEEE Standard for a High Performance Serial Bus, IEEE Std. 1395-1995, Dec. 1995, pp. 1-392, NY, in U.S. Appl. No. 10/860,399.

Kester, W., Origins of Real-World Signals and Their Units Measurement, ch. 1, pp. 1.1-1.11, 2003, in U.S. Appl. No. 11/772,178.

Kilger, R. et al., "Micromachined magnetics: a new step in the evolution of isolation technology," Electronic Engineering, Jun. 2000 at pp. 27-32, in U.S. Appl. No. 11/772,178.

Klein William, Applications of Signal Isolation, Sensors Magazine, Apr. 2000, pp. 70-74, in U.S. Appl. No. 10/860,399.

Knoedl, G., A Monolithic Signal Isolator, IEEE, 1989, pp. 165-170, in U.S. Appl. No. 11/089,348.

Kojima, Yasuyuki, 2.3 kVac 100 MHz Multi-Channel Monolithic Isolator IC, 2000 Proceedings Annual IEEE International ASIC Conference, 2000, pp. 309-312, in U.S. Appl. No. 10/860,399.

Kojima, Yasuyuki, A Novel Monolithic Isolator for a Communications Network Interface IC, 1998 Proceedings Annual IEEE International ASIC Conference, 1998, pp. 255-258, in U.S. Appl. No. 10/860,399.

Kuhn, William, An RF-Based IEEE 1394 Ground Isolator Designed in a Silicon-on-Insulator Process, 44th IEEE 2001 Midwest Symposium on Circuits and Systems, Aug. 2001, pp. 764-767, in U.S. Appl. No. 10/860,399.

Lam, Sam, High-Isolation Bonding Pad Design for Silicon RFIC up to 20 GHz, IEEE Electron Device Letters, Sep. 2003, vol. 24, No. 5, pp. 601-603, in U.S. Appl. No. 10/860,399.

Long, John R., Monolithic Transformers for Silicon RF IC Design, IEEE Journal of Solid-State Circuits, Sep. 2000, vol. 35, No. 9, pp. 1368-1382, in U.S. Appl. No. 10/860,399.

Martel, Jesus, Analysis of a Microstrip Crossover Embedded in a Multilayered Anisotropic and Lossy Media, IEEE Transactions on Microwave Theory and Techniques, Mar. 1994, pp. 424-432, vol. 32, No. 3, in U.S. Appl. No. 10/860,399.

Munzer, M., Coreless transformer a new technology for half bridge driver IC's, pp. 1-4, 2000, in U.S. Appl. No. 11/772,178.

Simburger, Werner, A Monolithic Transformer Coupled 5-W Silicon Power Amplifier with 59% PAE at .9Ghz, IEEE Journal of Solid-State Circuits, Dec. 1999, vol. 34, No. 12, pp. 1881-1892, in U.S. Appl. No. 10/860,399.

Tang, S.C., A Low-Profile Wide-Band Three-Port Isolation Amplifier with Coreless Printed-Circuit-Board (PCB) Transformers, IEEE Transactions on Industrial Electronics, Dec. 2001, Vol. 48, No. 6, pp. 1180-1187, in U.S. Appl. No. 10/860,399.

Walker, Geoff, An Isolated Mosfet Gate Driver, pp. 1-6, 1996, in U.S. Appl. No. 11/772,178.

Walker, Geoffry, Modulation and Control of Multilevel Converters, Thesis submitted for Doctor of Philosophy (The University of Queensland), Nov. 16, 1999, pp. 1-202, in U.S. Appl. No. 10/860,399.

Ward Titus, John Kenney, "10 GHz VCO for 0.13um CMOS Sonet CDR," Analog Devices, pp. 1-4, Jun. 2006, in U.S. Appl. No. 11/772,178.

Wolfs, P.J., An Improved Transformer Coupled MOSFET/IGBT Driver, Journal of Electrical and Electronic Engineering, Australia—IE Aust. & IREE Aust., Sep. 1991, vol. 11, No. 3, pp. 197-200, in U.S. Appl. No. 10/860,399.

Zhou, Jian-Jun and Allstot, David, A Fully Integrated CMOS 900MHz LNA Utilitzing Monolithic Transformers, ISSCC Digest of Technical Papers, pp. 132-133, 1998, in U.S. Appl. No. 11/089,348.

Zhou, Jianjun, Monolithic Transformers and Their Application in a Differential CMOS RF Low-Noise Amplifier, IEEE Journal of Solid-State Circuits, Dec. 1998, pp. 2020-2027, in U.S. Appl. No. 11/772,178.

* cited by examiner

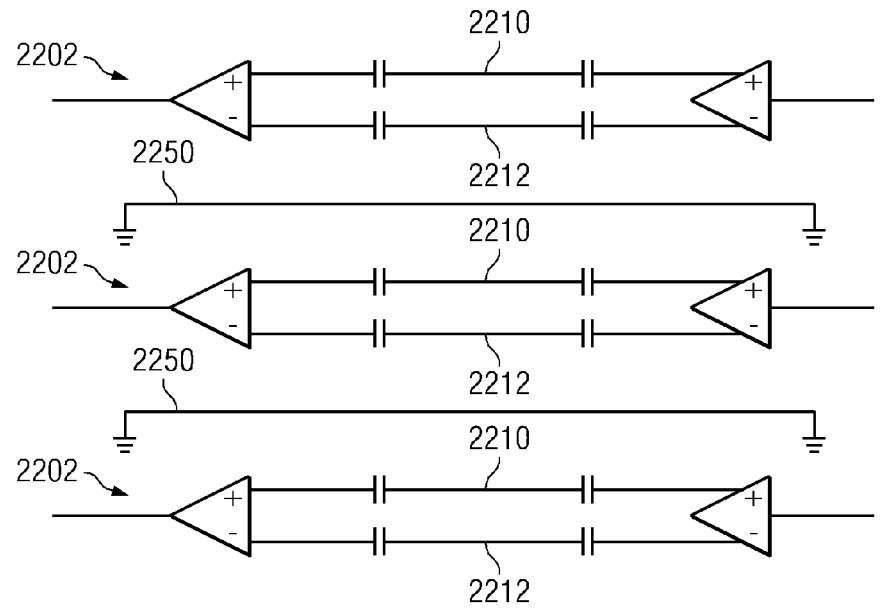
FIG. 22c
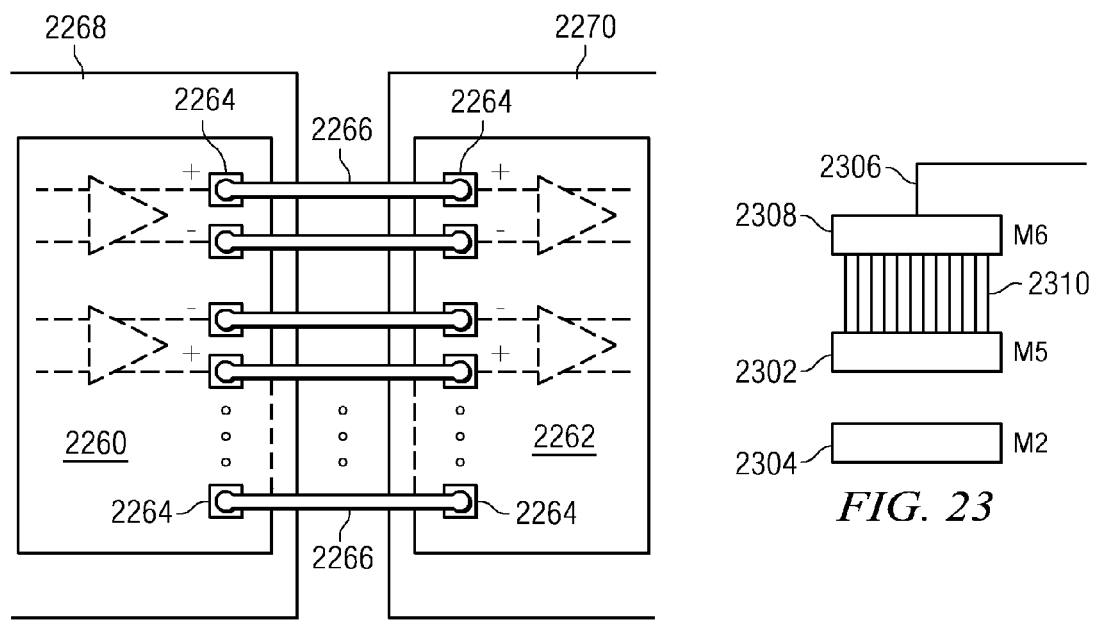
FIG. 22d
FIG. 23

CAPACITIVE ISOLATION CIRCUITRY

CROSS-REFERENCE TO RELATED APPLICATIONS

The present invention is a Continuation-in-Part of U.S. patent application Ser. No. 11/772,178, filed Jun. 30, 2007, entitled "BIDIRECTIONAL MULTIPLEXED RF ISOLATOR," which is a continuation-in-part of U.S. application Ser. No. 11/089,348 filed on Mar. 24, 2005 entitled SPREAD SPECTRUM ISOLATOR which is a continuation-in-part of U.S. Pat. No. 7,421,028 issued on Sep. 2, 2008, entitled TRANSFORMER ISOLATOR FOR DIGITAL POWER SUPPLY; U.S. Pat. No. 7,447,492 issued on Nov. 4, 2008, entitled ON-CHIP TRANSFORMER ISOLATOR; U.S. Pat. No. 7,376,212 issued on May 20, 2008, entitled RF ISOLATOR WITH DIFFERENTIAL INPUT/OUTPUT; U.S. Pat. No. 7,460,604 issued on Dec. 2, 2008, entitled RF ISOLATOR FOR ISOLATING VOLTAGE SENSING AND GATE DRIVERS; and the present invention is a Continuation-in-Part of co-pending U.S. patent application Ser. No. 12/060,049 filed on Mar. 31, 2008 entitled CAPACITIVE ISOLATOR. All of the above are incorporated herein by reference in their entirety.

TECHNICAL FIELD

The present invention relates to digital isolators, and more particularly, to digital isolators providing isolation for voltage sensing and gate drivers.

BACKGROUND

Within power conversion products, there is a need for high speed digital links that provide high isolation at a low cost. Typical digital links within power conversion products require a speed of 50-100 megabits per second. Isolation between the input and output of power conversion products is required in the range of 2,500-5,000 V. Existing solutions for providing a high speed digital isolation link have focused on the use of magnetic pulse couplers, magnetic resistive couplers, capacitive couplers, inductive couplers and optical couplers.

Referring now to FIG. 1, there is illustrated the general block diagram of a system using a magnetic pulse coupler to isolate a digital link 102 between a driver 104 and a detector 106. The driver 104 resides upon one side of the digital link 102 and transmits information over the digital link 102 to the detector 106 residing on the other side of the digital link. Resting between the driver 104 and detector 106 is a pulse transformer 108. The pulse transformer 108 provides an electromagnetically coupled transformer between the driver 104 and detector 106. The pulse transformer 108 generates a pulse output in response to a provided input from the driver as illustrated in FIG. 2. The input from the driver 104 consists of the two pulses 202 and 204. Each pulse 202, 204 consists of a rising edge 206 and a falling edge 208. In response to a rising edge 206, the output of the pulse transformer 108 generates a positive pulse 210. The falling edge 208 of a pulse generates a negative pulse 212. The pulse transformer circuit illustrated with respect to FIGS. 1 and 2 suffers from a number of deficiencies. These include start-up where the detector 106 will not know at what point the input from the driver has begun, whether high or low until a first edge is detected. Additionally, should any error occur in the pulse output of the pulse transformer 108, the detector 106 would have a difficult time determining when to return to a proper state since there may be a long period of time between pulses.

Referring now to FIG. 3, there is illustrated an alternative prior art solution making use of a magneto resistive coupler. The magneto resistive coupler 302 consists of a resistor 304 and associated transformer 306. The resistor 304 has a resistance value that changes responsive to the magnetic flux about the resistor. The transformer detector 306 utilizes a wheatstone bridge to detect the magnetic flux of the resistor and determined transmitted data.

Another method of isolation between a driver 404 and a detector 406 is illustrated in FIG. 4. The driver 404 and the detector 406 are isolated on opposite sides of a digital link 402 by a capacitor 408. The capacitor 408 capacitively couples the driver 404 and detector 406 together to achieve a level of isolation. A problem with the use of capacitive coupling to isolate digital links is that capacitive coupling provides no common mode rejection.

An additional problem with some isolator designs involves the reception of RF interference from nearby transmitting GSM, DCS and CDMA cellular telephones. The problem is caused by the application printed circuit board acting as a dipole antennae at GHz frequencies. This results in large common mode signals being seen at the isolator at RF frequencies. Some manner for minimizing these large common mode signals at GHz frequencies would be highly desirable.

Thus, an improved method for providing isolation over high speed digital links within power supply components would be greatly desirable.

SUMMARY

The present invention as disclosed and described herein, in one aspect thereof comprises an integrated circuit having voltage isolation capabilities includes a plurality of communications channels for transceiving data from the integrated circuit. Each of the communications channel includes capacitive isolation circuitry located in conductive layers of the integrated circuit for providing a high voltage isolation link. The capacitive isolation circuitry distributes a first portion of a high voltage isolation signal across a first group of capacitors on a first link and a second link in the capacitive isolation circuitry and distributes a second portion of the high voltage isolation signal across a second group of capacitors in the first link and the second link in the capacitive isolation circuitry. A differential receiver on each of the plurality of communications channels receives the data on the first link and the second link. A differential transmitter on each of the plurality of communications channels transmits the data on the first link at a selected one of a first phase and a second phase and for transmitting the data on the second link at the selected one of the first phase and the second phase. The second phase is 180 degrees out of phase with the first phase. Each of the differential transmitters controls the selection of the first phase and the second phase on each of the first link and the second link such that only a same phase is cross coupled onto a selected communications channel from adjacent communications channels.

BRIEF DESCRIPTION OF THE DRAWINGS

For a more complete understanding of the present invention and the advantages thereof, reference is now made to the following description taken in conjunction with the accompanying Drawings in which:

FIG. 22c illustrates the use of a dummy wire for eliminating cross coupling between adjacent channels;

FIG. 22d illustrates the layout of the bond wires between the two die;

FIG. 23 illustrates the manner for connecting a bond wire directly with a capacitive plate rather than using bonding pads;

DETAILED DESCRIPTION

Figure 1:
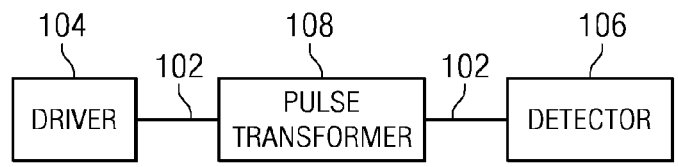
FIG. 1 illustrates a block diagram of a prior art magnetic pulse coupler isolator.
Figure 2:
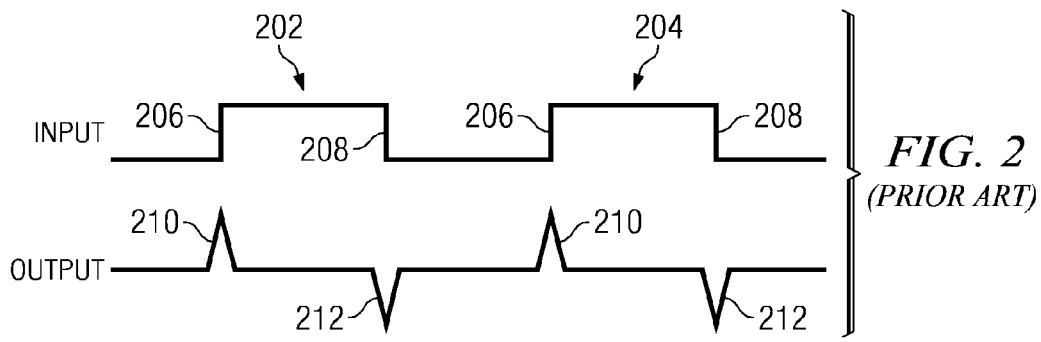
FIG. 2 illustrates the input and output signals of the prior art magnetic pulse transformer of FIG. 1.
Figure 3:
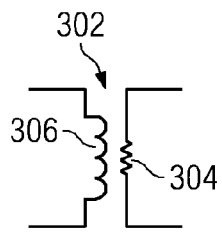
FIG. 3 illustrates a prior art magneto resistive coupler.
Figure 4:
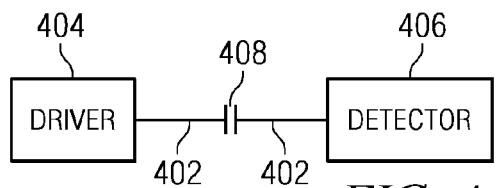
FIG. 4 illustrates a prior art capacitive coupler.

Referring now to the drawings, wherein like reference numbers are used herein to designate like elements throughout, the various views and embodiments of a capacitive isolation circuit are illustrated and described, and other possible embodiments are described. The figures are not necessarily drawn to scale, and in some instances the drawings have been exaggerated and/or simplified in places for illustrative purposes only. One of ordinary skill in the art will appreciate the many possible applications and variations based on the following examples of possible embodiments.

Figure 5:
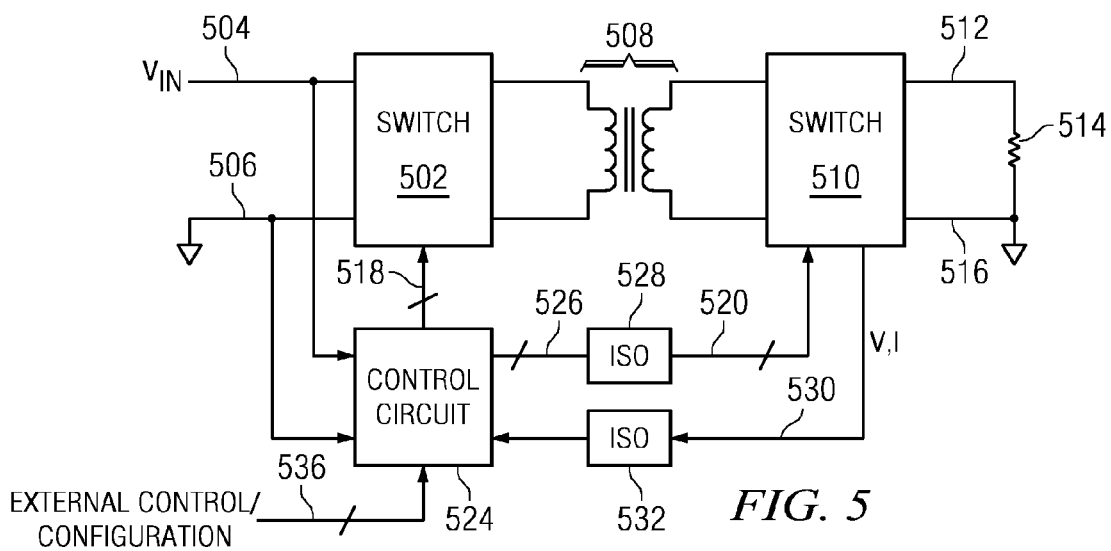
FIG. 5 illustrates a switched power supply including isolation circuitry.

Referring now to the drawings, and more particularly to FIG. 5, there is illustrated a block diagram of a DC-DC switching power supply utilizing a capacitive isolation link. Switching power supplies utilize a plurality of switches which are turned on and off to switch an input DC voltage across an inductor to a load, the output voltage at a different DC voltage level. By switching the current inductively coupled through the inductor to the load in a particular manner, a DC output voltage at a different voltage level than the input DC voltage can be provided to the load. The controlled switching is typically facilitated with some type of control circuit. This control circuit can be an analog control circuit formed from a plurality of analog discrete devices, or it can be a digital circuit. In digital control circuits, digital signal processors (DSPs) and microcontroller units (MCU) have been utilized. The DSPs control the duty cycle and relative timing of the switches such that the edges of each control pulse to the various transistor switches controlling power delivery to the load is varied. In order to perform this operation in the digital domain, the DSP must perform a large number of calculations, which requires a fairly significant amount of code to be generated to support a specific power supply topology, operating frequency, component characteristics and performance requirements. For example, inductor size decreases with increasing PWM frequency, dead times increase with increasing transistor turn-off times, and so on. Although DSPs can handle the regulation tasks, they are fairly complex and expensive and code changes in power supply applications are difficult.

Referring further to FIG. 5, the power supply includes a primary switch group 502 that is operable to receive an input voltage on a node 504, this being a DC voltage, and ground on a node 506. The primary switch group 502 is coupled through a transformer 508 to a secondary switch group 510. The secondary switch group 510 is operable to drive an input voltage node 512 that is connected to one terminal of a load 514, the secondary switch group 510 also having a ground connection on a node 516, the load 514 disposed between the node 512 and the node 516. The two switch groups 502 and 510 are operable to operate in conjunction with various pulse inputs on a control bus 518 associated with the primary switch group 502 and with various pulse inputs on a control bus 526 associated with the secondary switch group 510.

A digital control circuit 524 is provided for controlling the operation of the primary switch group 502 and the secondary switch group 510. The voltages on nodes 504 and 506 are provided as inputs to the digital control circuit 524 for sensing the voltage and current on the primary side, the digital control circuit 524 generating the information on the bus 518 for control of the primary switch group 502. The control circuit 524 must be isolated from the secondary group switch 510, since there can be a significant DC voltage difference therebetween. This is facilitated by driving the bus 526 through a capacitive isolation circuit 528, such as the capacitive isolation circuit which will be discussed herein below, to drive the bus 520. Similarly, the control circuit 524 is operable to sense the voltage and current levels on the output node 512 through sense lines 530 which are also connected through a capacitive isolation circuit 532 to the digital control circuit 524. The digital control circuit 524 is also interfaced to a bus 536 to receive external control/configuration information. This can be facilitated with a serial databus such as an SMB serial databus.

Figure 6:
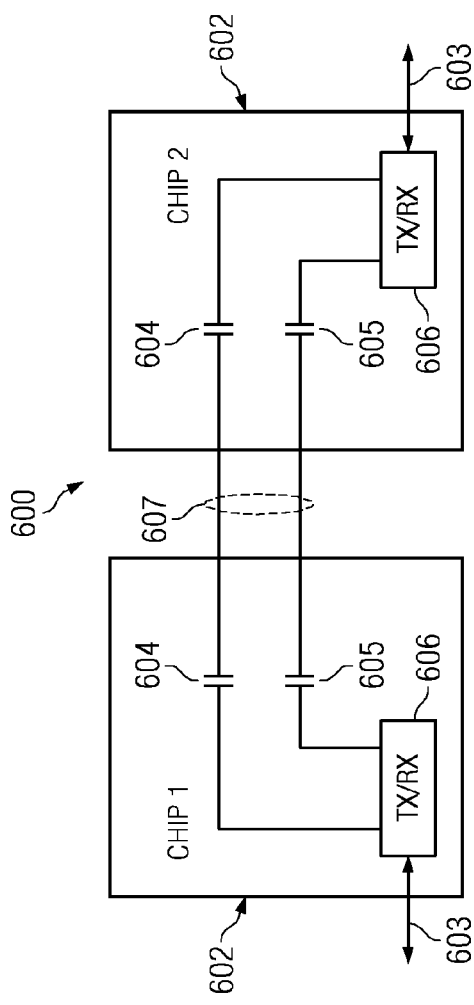
FIG. 6 illustrates a capacitive isolation link of the present disclosure.

Referring now to FIG. 6, there is illustrated the capacitive isolation link of the present disclosure. The capacitive isolation link 600 of the present disclosure is implemented by integrating a portion of the link for a single channel implementation in two galvanically isolated chips or dies between which a high rate data link with voltage isolation is required. Each chip 602 includes a pair of capacitors 604 and 605 and transmit and receive circuitry 606 for providing the capacitive isolation link 600 between the chips. The capacitors may comprise vertical, horizontal or finger capacitors. Alternatively, the chip 602 could include only transmit circuitry or receive circuitry with the partnered chip, including a corresponding receiver or transmitter. RF signals are generated within the transmit/receive circuitry 606 on one side of the capacitive isolation link, and the RF signals are transmitted between the chips 602 utilizing the connection through capacitors 604 and 605 in each chip and the capacitive coupling therebetween.

Once the RF signals are received at the receiving side, the transmit and receive circuitry 606 detects the data contained within the transmission from the first chip and utilizes the data as appropriate. While the description with respect to FIG. 6 only illustrates the capacitors 604 and 605 and transmit and receive circuitry 606 within each chip 602, additional circuitry will be implemented on the chips 602 for performing processing functions associated with the data transmitted over the capacitive isolation link 600. The data transmitted over the capacitive isolation link 600 may be transmitted using either frequency modulation techniques or amplitude modulation techniques. In the preferred embodiment of the disclosure, discussed with respect to FIG. 7 herein below, AM modulation is used for transmitting the data. This may also be referred to as on/off key modulation.

In operation, each of the transmit/receive circuits 606 operates in either transmit or receive mode. In the transmit mode, digital data received on a digital bus 603 is serially transmitted from one of the transmit/receive circuits 606 to the other one on the other of the dies 602. This is facilitated by driving the signal across capacitors 604 and 605 such that energy is coupled across the capacitors. This will allow energy to be transmitted on transmission lines 607 that couple the capacitors 604 and 605 together. A first side of capacitors 604 and 605 are associated with the input signal and energy associated therewith is coupled across the high voltage isolation boundary created by the capacitors and onto the transmission line 607. As will be described herein below, both of the transmit/receive circuits 606 and capacitors 604 and 605 are fabricated on an integrated circuit utilizing conventional processing techniques and available conductive layers that are shared with the transmit/receive circuits. There will be a loss associated with the coupling coefficient across the capacitor such that the amount of energy that can be delivered from the transmit/receive circuit 606 to the transmission line 607 is reduced and, further, there will be more loss at certain frequencies than others.

Figure 6A:
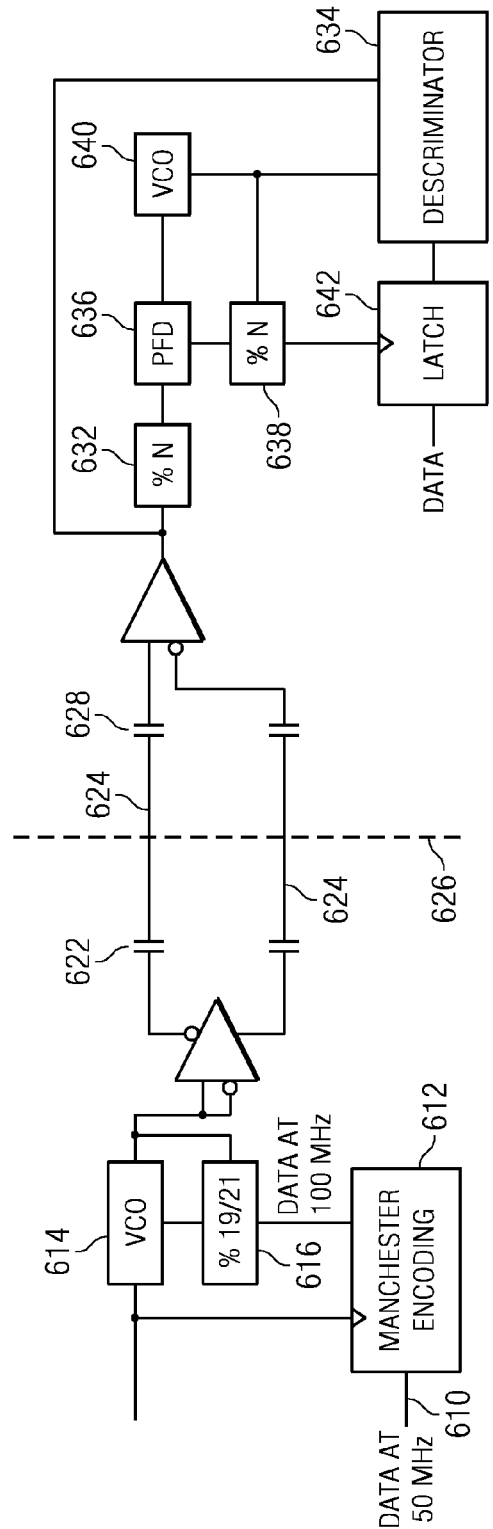
FIG. 6a illustrates a schematic block diagram of a circuit for providing the capacitive isolation link using frequency modulation.

Referring now to FIG. 6a, there is illustrated an alternate embodiment of the switching power supply utilizing frequency modulation to transmit data between a pair of chips over a capacitive isolation link 600. The description with respect to FIG. 6a is merely provided as an illustration of one potential embodiment of an FM circuit used for creating an RF isolation link, and one skilled in the art would realize the possibility of numerous additional embodiments. The data is input on a data bus 610 into a Manchester encoding circuit 612, a conventional data encoding circuit. Also input to the Manchester encoding circuit 612 is a clock signal. The clock signal is also input to a voltage controlled oscillator 614. Data is output from the Manchester encoding circuit 612 and applied to a divide circuit 616. A second input of the divide circuit 616 is connected to the output of the voltage controlled oscillator 614. The output of the divide circuit 616 is connected to a second input of the voltage controlled oscillator 614 to allow modulation thereof with the Manchester encoding circuit 616. The voltage controlled oscillator 614 outputs a frequency modulated signal representing the received data on bus 610 to a differential driver 618. The FM modulated signal is transmitted from the differential driver 618 through capacitors 622 onto transmission lines 624 passing across an interface 626 between either a first and second chip that are to be voltage isolated from each other on first and second dies.

The received data signal is capacitively coupled onto the receiver circuitry by a second pair of capacitors 628. The received signal passes through a differential receiver 630 whose output is applied to a Divide-by-N circuit 632 and a discriminator circuit 634. The output of the Divide-by-N circuit 632 is applied to the input of a PFD (phase/frequency detector) circuit 636. A second input to the PFD circuit 636 is provided by a second Divide-by-N circuit 638 having its input connected to the output of the voltage controlled oscillator 640. The input of the voltage controlled oscillator 640 is connected to the output of the PFD circuit 636. The output of the voltage controlled oscillator 640 is connected to a second input of the discriminator 634, this being a phase locked output that is phase locked to the data clock. The discriminator circuit 634 determines the data contained within the received signal responsive to the output of the voltage controlled oscillator 640 and the limiter 630. This data is provided to a latch circuit 636 having its clock input connected to the output of the Divide-by-N circuit 638. The data output of the receiver is provided from the latch circuit 642. Other types of modulation such as phase shift, on/off key modulation, etc. may be used.

Figure 7:
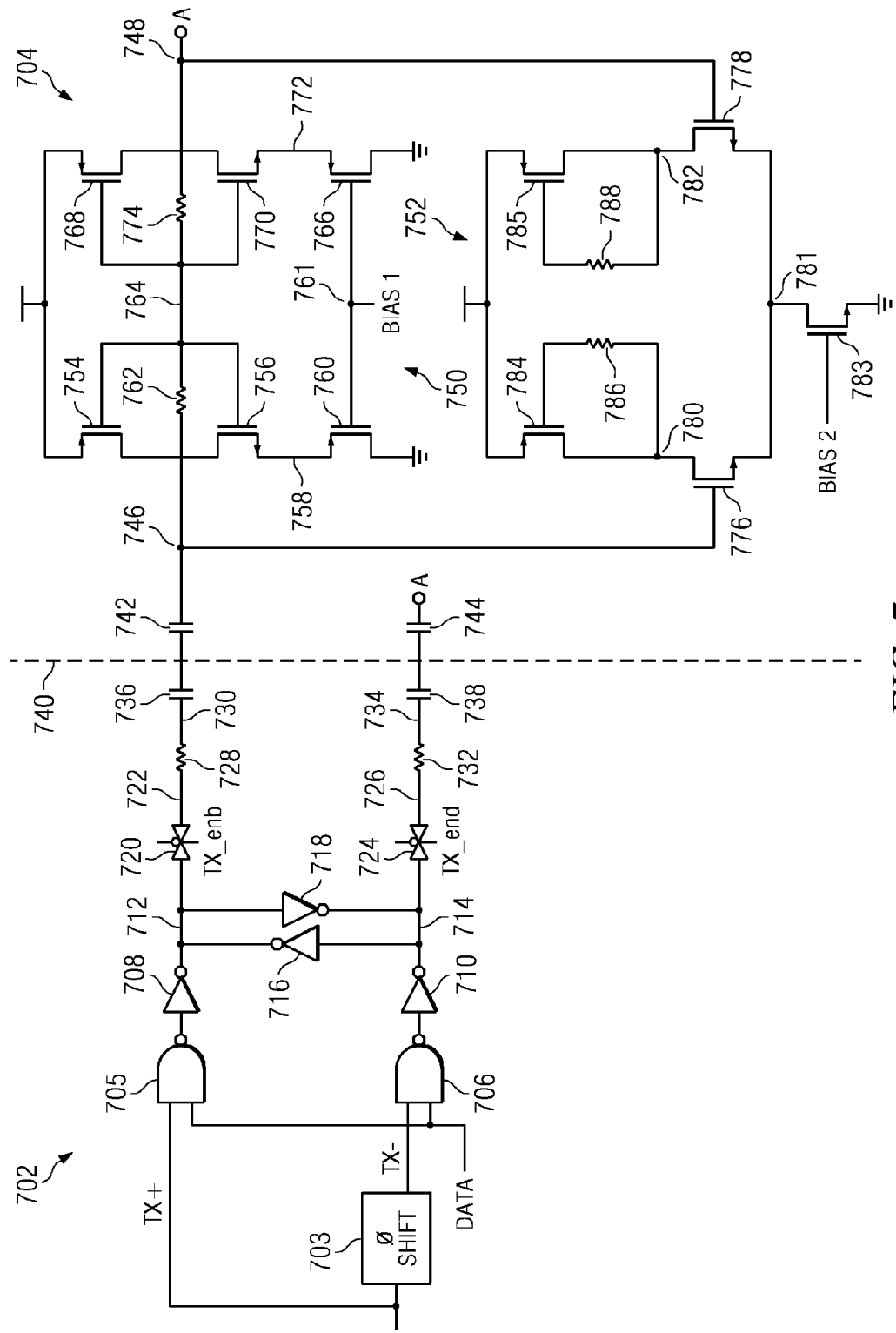
FIG. 7 illustrates a schematic diagram of the circuitry for providing the capacitive isolation link using amplitude modulation.

Referring now to FIG. 7 there is illustrated a disclosed embodiment of the capacitive isolation link 600 of the present disclosure wherein on/off key amplitude modulation is used to transmit data over the link. The capacitive isolation link 600 consists of transmitter circuitry 702 and receiver circuitry 704 (a differential receiver). The transmitter circuitry 702 consists of a pair of NAND gates 705 (a differential driver) and 706 having first inputs connected to receive the data to be transmitted over the capacitive isolation link and a second input connected to receive an RF carrier signal (1.0 GHz). In addition to RF signals it is noted that other types of AC (alternating current) signals may be used for the transmissions. The RF carrier signal applied to NAND gate 706 first goes through a phase shifter 703 which phase shifts the RF carrier 180 degrees. The output of each of the NAND gates 705 and 706 are connected to the inputs of inverters 708 and 710 respectively. The output of each of the inverters 708 and 710 are connected to nodes 712 and 714, respectively. An inverter 716 has its input connected to node 714 and its output connected to node 712. A second inverter 718 has its input connected to node 712 and its output connected to node 714. A first transmission gate 720 has its input connected to node 712 and its output connected to node 722. A second transmission gate 724 has its input connected to node 714 and its output connected to node 726. A resistor 728 is connected between node 722 and node 730. A second resistor 732 is connected between node 726 and node 734. Node 730 is connected with a first isolation capacitor 736 and node 734 is connected with a second isolation capacitor 738. The transmission gates 720 and 724 are enabled when the differential driver circuit is transmitting data over the capacitive isolation link. The RF transmission signal is continually applied to one input of NAND gates 705 and 706. When a 1-bit is also transmitted on the other input of the NAND gates 705 and 706, the RF signal is transmitted over each of the transmission lines of the capacitive isolation link with the RF signal on the TX− line being 180 degrees out of phase with the RF signal on the TX+ line. When a 0-bit is applied to the inputs of NAND gates 705 and 706, no RF signal is transmitted over the capacitive link.

The capacitors 736 and 738 are connected across an isolation barrier 740. As is more fully described herein below, the isolation barrier may be between different chips or different dies on a single chip to provide for galvanic isolation. Capacitors 736 and 738 connect across the isolation barriers with isolation capacitor 742 and 744, respectively. Capacitors 742 and 744 are associated with the receiver circuitry 704. Capacitor 742 connects with the receiver circuitry at node 746. Capacitor 744 connects with the receiver circuitry at node 748. The receiver circuitry comprises a differential receiver consisting of a bias and transient common mode clamp circuitry 750 for preventing the receiver node from floating and limiting the input common mode voltage to the receiver from exceeding the operating range of the receiver protecting a receiver amplifier 752. The receiver amplifier 752 detects a received signal. The bias and transient clamp circuitry 750 comprises a P-channel transistor 754 having its source/drain path connected between $V_{DD}$ and node 746. An N-channel transistor 756 has its drain/source path connected between node 746 and node 758. A P-channel transistor 760 has its source/drain path connected between node 758 and ground. A resistor 762 is connected between node 746 and node 764. The gates of each of transistors 754 and 756 are connected to node 764. The gate of transistor 760 connects with the gate of a transistor 766 which is connected to a circuit (not shown) providing a bias voltage BIAS 1. Transistor 768 is a P-channel transistor having its source/drain path connected between $V_{DD}$ and node 748. An N-channel transistor 770 has its drain/source path connected between node 748 and node 772. The P-channel transistor 766 having its gate connected with transistor 760 has its source/drain path connected between node 772 and ground. The gates of each of transistors 770 and 756 are connected to node 764. A resistor 774 is connected between node 748 and node 764. The bias and common clamp circuitry 750 clamps the receive input nodes to keep it from floating when no RF signal is applied and clamps the input voltage to the receiver.

The receiver amplifier 752 interconnects with the isolation capacitors at nodes 746 and 748 respectively. These nodes are connected with the gates of N-channel transistors 776 and 778. Transistor 776 is connected between nodes 780 and 781. Transistor 778 has its drain/source path connected between node 782 and node 781. A transistor 783 has its drain/source path connected between node 781 and ground. The gate of transistor 783 is connected to bias circuitry (not shown) providing a bias voltage BIAS 2. A P-channel transistor 784 has its source/drain path connected between $V_{DD}$ and node 780. A transistor 785 has its source/drain path connected between $V_{DD}$ and node 782. A resistor 786 is connected between the gate of transistor 784 and node 780. A resistor 788 is connected between the gate of transistor 785 and node 782. The receive signals over the capacitive link can be detected at either of nodes 780 and 782 and the received signal are offset from each other by 180 degrees.

Figure 8:
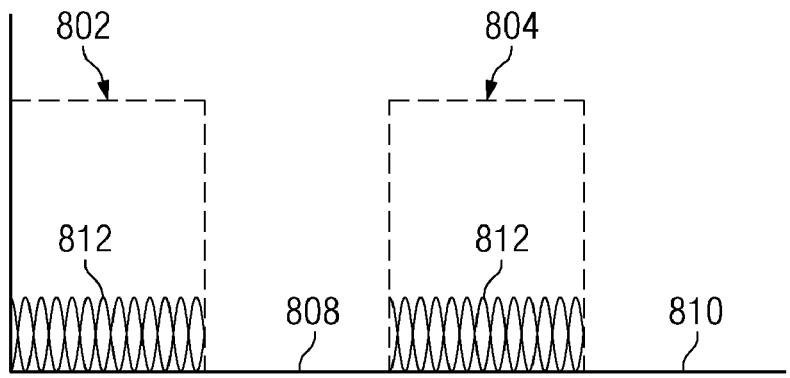
FIG. 8 illustrates the waveforms present on the transmit side of the capacitive isolation link of FIG. 7.
Figure 8A:
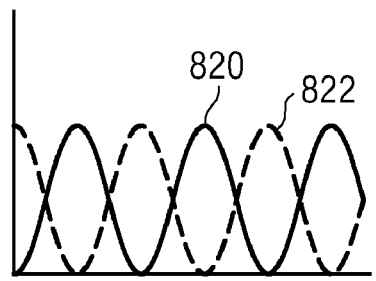
FIG. 8a illustrates a zoom in view on the transmit side of the waveform of FIG. 8.
Figure 9:
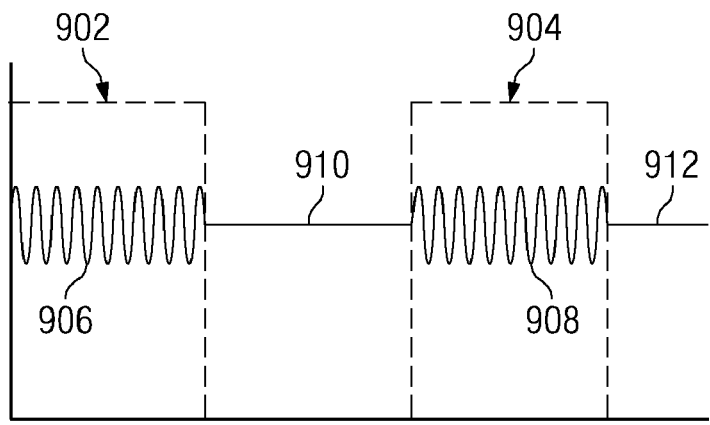
FIG. 9 illustrates the waveforms present on the receiving side of the capacitive isolation link of FIG. 7.

Referring now to FIGS. 8, 8a and 9, there are illustrated the waveforms and data provided at the transmission side (FIGS. 8 and 8a) of a capacitive isolation link 600 and the receive side (FIG. 9) of the capacitive isolation link. On the transmission side illustrated in FIG. 8, the data 800 is either transmitted as a one bit (high) or zero bit (low). A one bit pulse is indicated at 802 and 804. A zero bit pulse is indicated at 808 and 810. The transmit data provided to the capacitive link is illustrated by the waveform 812. The transmit data waveform represents the 1 GHz RF carrier signal. When a logical "1" data bit is being transmitted and the data signal is high, the presence of the RF carrier is provided at the transmit data output. The RF carrier signal can be of any frequency. The use of different frequencies enables the provision of lower power circuitries with lower frequencies. When a logical "0" bit is being transmitted, the signal is virtually zero at the transmit data output. Thus, whether a logical "1" bit or a logical "0" bit is transmitted is indicated either by the presence or absence of the RF carrier signal.

FIG. 8a illustrates the manner in which the wave form 812 is transmitted on each of the transmission lines of the capacitive link 600. A first RF signal 820 comprises the information transmitted on the TX+ line of the capacitive link from the differential driver. The wave form 822 comprises the inverted format of the RF signal on the TX− line that is 180 degrees out of phase with signal 820.

FIG. 9 illustrates the waveforms associated with the receiver 704. The received data for the logic "1" bit is represented at points 902 and 904 and indicates the two 1 GHz RF carrier pulses transmitted from the transmitter 702 of the capacitive isolation link 600. The received pulses are amplified by the amplifier 752 such that the pulses are represented by the amplified waveform pulses 906, 910 and 908. The detector data output rises to $V_{DD}$ at points 910 and 912 when no RF carrier signal is detected indicating a logical "0." When an RF carrier signal is detected, the output of the detector 706 begins to vary at points 906 and 908 indicating a logical "1," this being the result of an increase in the NMOS current in transistors 776 and 778.

Figure 10:
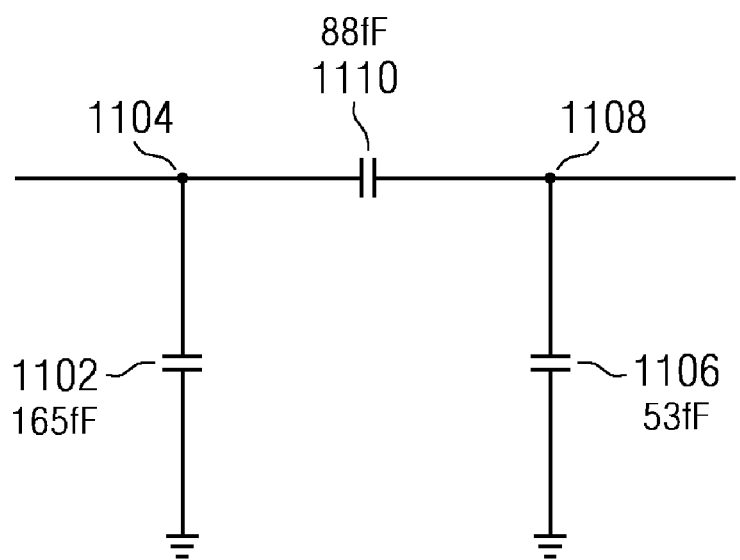
FIG. 10 illustrates a model of one of the capacitive isolation links.

Referring now to FIG. 10, there is illustrated a model for the capacitors 716, 720, 722 and 726. Capacitor 1102 represents a 165 fF capacitor connected between node 1104 and ground. Capacitor 1106 represents a 53 fF capacitor connected between node 1108 and ground. Connected between node 1104 and node 1108 is represented by an 88 fF capacitor 1110.

Figure 11:
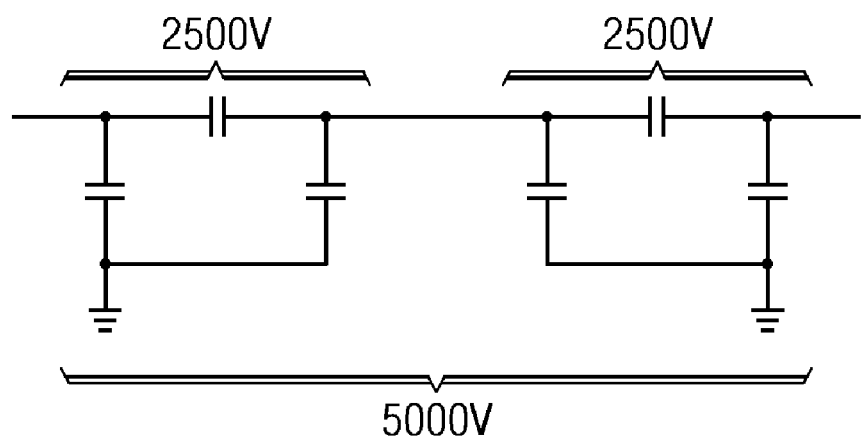
FIG. 11 illustrates the voltages across each capacitor included within a capacitor isolation link and across the entire capacitive isolation link.

Using the RF isolation links 600 described above, voltage isolation of up to 5,000 volts may be achieved, 2,500 volts for each side. Thus, as illustrated in FIG. 11, the RF isolation circuit 602 may provide 5,000 volts of isolation between a first chip 602a and a second chip 602b. While the voltage between the input terminals of the chip 602a will be zero volts, and the voltage between the input terminals of the chip 602b will also be zero volts, the total voltage difference between the two chips may be 5,000 volts with a 2,500 voltage difference across each of the capacitors associated with the interfaces to the capacitive isolation circuit on each chip 602.

Figure 12A:
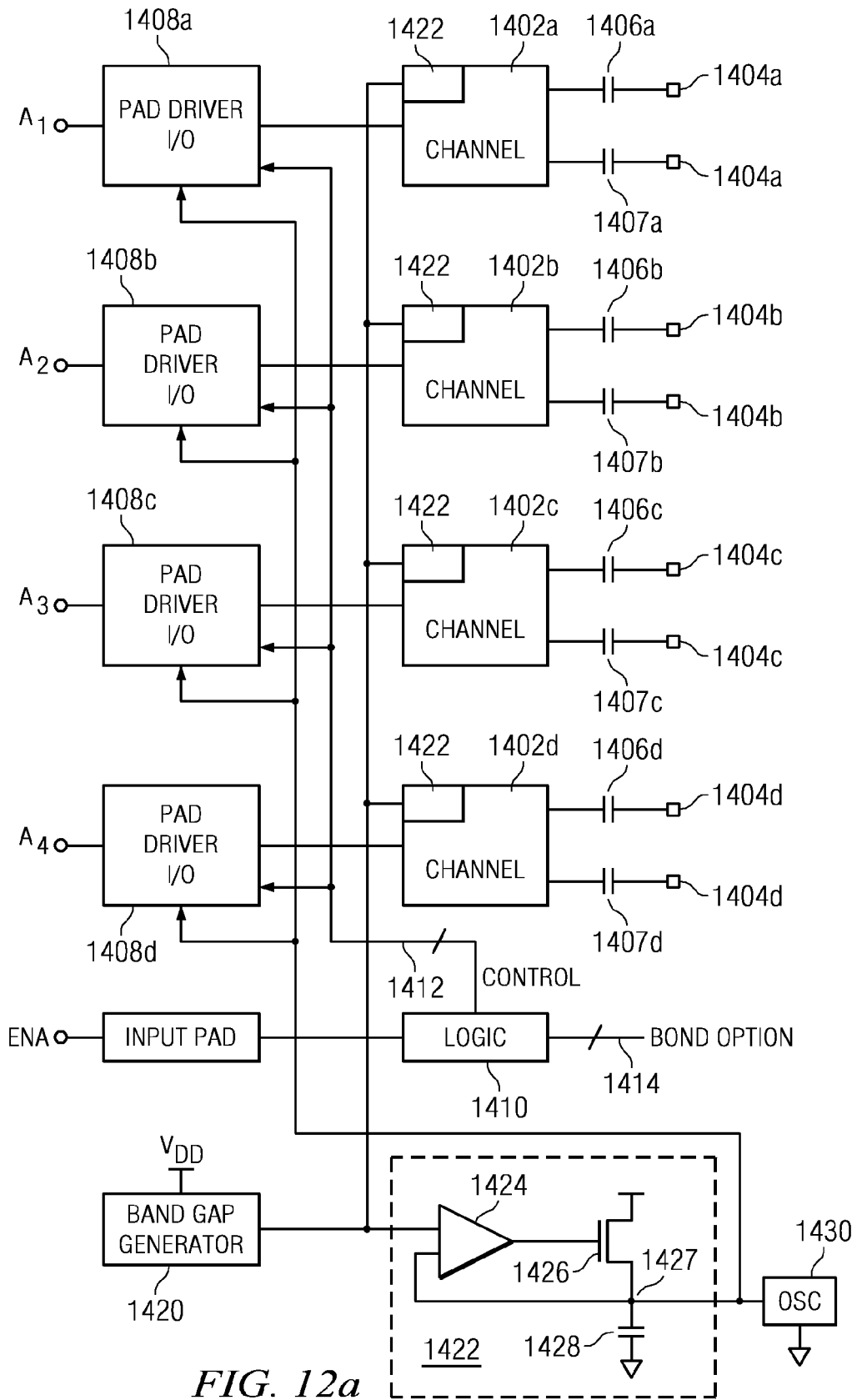
FIG. 12a is a block diagram illustrating the circuitry included within a chip on one side of the capacitive isolation link for providing multiple isolation link channels.

Referring now to FIG. 12a, there is illustrated a block diagram of the structure of an interface of a single chip 602 including a portion of a plurality of channels 1402 including the capacitive isolation link of the present disclosure. Each channel 1402 consists of the a pair of capacitors 1406 and 1407 and transmit and/or receive circuitry described with respect to FIG. 7. Data may be either input or received at the interface 1404 of the capacitive isolator. Each channel 1402 is interconnected with a pad driver 1408 that either drives transmitted data from the pad driver over channel 1402 to be output over the interface 1404 or drives received data to the associated pad of the chip 602. The manner in which data can be either transmitted or received over a particular channel 1402a is controlled on the chip 602 by logic circuitry 1410 providing control over various control lines 1412. The manner in which the logic control 1410 controls whether a channel is used for transmitting or receiving is set by input bond pad options 1414. Thus, in this embodiment, data is received as either a logic "1" or a logic "0" and the associated capacitive isolator is driven, when a pad is configured as a transmitter, (or not driven) accordingly. For received data on the associated capacitive isolator, when configured to receive data, the output of the pad is either high or low.

A common oscillator circuit 1430 is also associated with all of the channels of the interface. A band gap generator 1420 is provided on-chip and connected to $V_{DD}$ to provide a band gap reference voltage to a regulator circuit 1422. While the description with respect to FIG. 12a only illustrates a single voltage regulator 1422, it will be noted that a separate voltage regulator 1422 will be associated with each of the channels of the interface for noise purposes. The voltage regulator 1422 consists of an amplifier 1424 having one input connected to the output of the band gap generator 1420. The output of the amplifier 1424 is connected to the gate of a transistor 1426. The drain-source path of the transistor 1426 is connected between $V_{DD}$ and a node 1427. Node 1427 is also connected to the second input of the differential amplifier 1424. A capacitor 1428 is connected between node 1422 and ground. Each of the channels 1402a, 1402b, 1402c and 1402d has a regulator 1422 associated therewith. Connected to node 1427 is an oscillator circuit 1430.

Figure 12B:
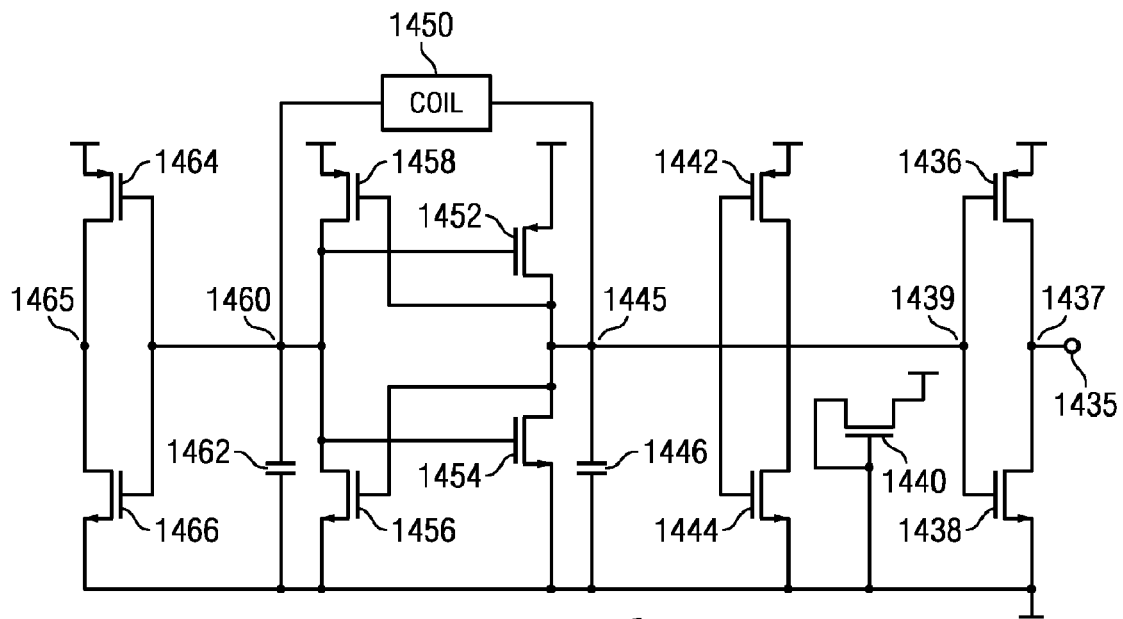
FIG. 12b is a schematic diagram of an oscillator circuit.

FIG. 12b illustrates the oscillator circuit 1430 of FIG. 12a. The output 1435 is connected to node 1437 between transistor 1436 and transistor 1438. The drain-source path of transistor 1436 is connected between $V_{DD}$ and node 1437. The drain-source path of transistor 1438 is connected between node 1437 and ground. The gates of transistor 1436 and 1438 are connected to each other through a node 1439. A transistor 1440 has its gate connected to ground and its drain-source path connected between $V_{DD}$ and the gate of transistor 1440. Node 1439 also interconnects transistor 1442 and transistor 1444. The drain-source path of transistor 1442 is connected between $V_{DD}$ and node 1439. The drain-source path of transistor 1444 is connected between node 1439 and ground. The gates of transistors 1442 and 1444 are interconnected with each other via node 1445. A capacitor 1446 is connected between node 1445 and ground. Node 1445 is connected to a first terminal of coil 1450. The second terminal of coil 1450 interconnects with the circuit via node 1460. Transistors 1452 and 1454 are interconnected via node 1445. The drain-source path of transistor 1452 is connected between $V_{DD}$ and node 1445. The drain-source path of transistor 1454 is connected between node 1445 and ground. The gates of both transistor 1452 and 1454 connect to node 1460. Transistors 1458 and 1456 are interconnected via node 1460. The drain-source path of transistor 1458 is connected between $V_{DD}$ and node 1460. The drain-source path of transistor 1456 is connected between node 1460 and ground. The gates of transistors 1458 and 1456 connect to node 1445. The capacitor 1462 is connected between node 1460 and ground. Also connected to node 1460 are the gates of transistors 1464 and 1466. The drain-source pathway of transistor 1464 is connected between $V_{DD}$ and node 1465, and the drain-source pathway of transistor 1466 is connected between node 1465 and ground. This oscillator therefore comprises a conventional LC oscillator.

Figure 12C:
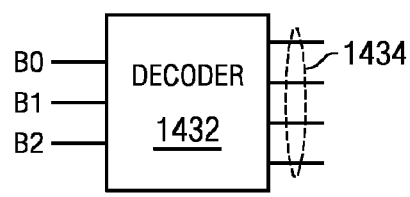
FIG. 12c is a block diagram of the logic circuit of FIG. 17.

Referring now to FIG. 12c, there is illustrated one embodiment of the circuitry which might be incorporated within the logic circuit 1410. In this embodiment, the logic circuit 1410 includes of a decoder 1432. The decoder has a total of three bond pad inputs B0, B1 and B2 for receiving the indication of the version of the chip being implemented. The outputs 1434 of the decoder are input to the appropriate channels such that the channel may be configured in either a transmission or reception mode.

Figure 13:
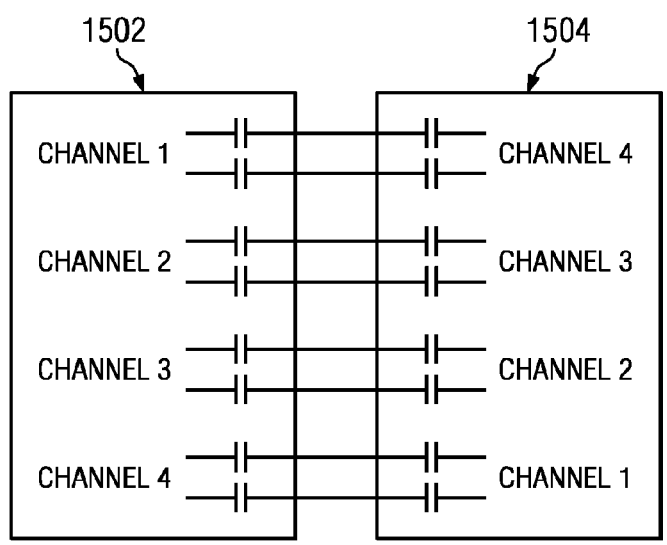
FIG. 13 illustrates a pair of chips within a single package including four separate channels for providing four isolated digital data links.

Referring now also to FIG. 13, there is illustrated the manner in which the single chip design described in FIG. 7 can be used to facilitate an entire capacitive isolation circuit including four separate capacitively isolated channels. A first chip 1502 is reversed such that the output channels 1402 between the first chip 1502 and the second chip 1504 are merely reversed. Thus, when viewing the chip 1502 from top to bottom of chip one, channel one is at the top, channel two is second, channel three is third and channel four is last. For the second chip 1504, the channels run in the opposite direction with channel one beginning at the bottom and channel four being at the top. The physical design of chip 1502 and chip 1504 are the same. Chip 1504 is merely reversed to facilitate the three versions of the chip as described below. Three different bond option versions may be selected for input to the logic circuit 1410 of the package containing the first chip 1502 and the second chip 1504 utilizing the decoder circuit 1432. Referring now to the Table 1, there are illustrated the three separate versions of operation for both the first chip 1502 and the second chip 1504 and the indication of whether the channel comprises a transmit or receive channel in the associated version.

TABLE 1

| Version | Chip | Ch. 1 | Ch. 2 | Ch. 3 | Ch. 4 |
|---------|------|-------|-------|-------|-------|
| 1 | 1 | Tx | Tx | Tx | Tx |
| 2 | 1 | Tx | Tx | Rx | Rx |
| 3 | 1 | Tx | Rx | Rx | Rx |
| 1 | 2 | Rx | Rx | Rx | Rx |
| 2 | 2 | Tx | Tx | Rx | Rx |
| 3 | 2 | Rx | Tx | Tx | Tx |

As can be seen, the associated chips 1502 and 1504 channels correspond, such that when a channel on one chip is transmitting or receiving, the corresponding channel on the other chip is doing the opposite.

Figure 14A:
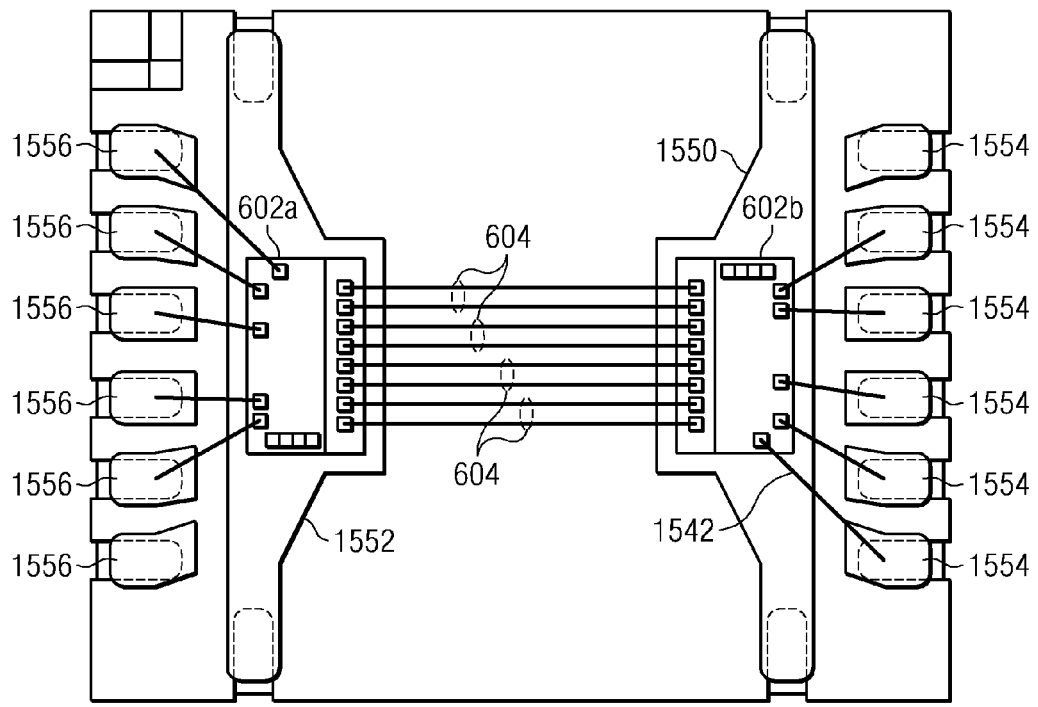
FIG. 14a illustrates the capacitive isolation link within a chip package.

Referring now to FIG. 14a, there is illustrated the capacitive isolation link 600 within a chip package. As discussed previously in FIG. 15, there are illustrated chips 1602a and 1602b interconnected by four separate channels 604. Each channel 604 is represented by two bond wires interconnecting the capacitors (not shown) within each of chips 1602a and 1602b. Each of chips 1602a and 1602b are also connected to various bond pads 1504 within the package by a connection line 1542 that provide connections to the other electronic circuitry.

The embodiment of FIG. 14a is referred to as a "split lead-frame" package. This is facilitated with the use of a lead frame 1550 on one side thereof and a lead frame 1552 on the other side thereof. Lead frame 1550 is interfaced with terminals 1554 and lead frame 1550 is interfaced with terminals 1556. During fabrication, the lead frames 1550 and 1556, which are not electrically connected to each other, provide support for the chips 602a and 602b, respectively. When the chips 602a and 602b are bonded onto their respective portions of the lead frame, they are then bonded to the appropriate terminals 1554 and 1556 and then the bond wires 604 disposed therebetween. The entire package is then encapsulated in a conventional encapsulate. Thus, the bond wires 604 each comprise a high frequency transmission line disposed between the two chips, each transformer associated with two bond wires that provide a "two-wire" transmission line.

Figure 14B:
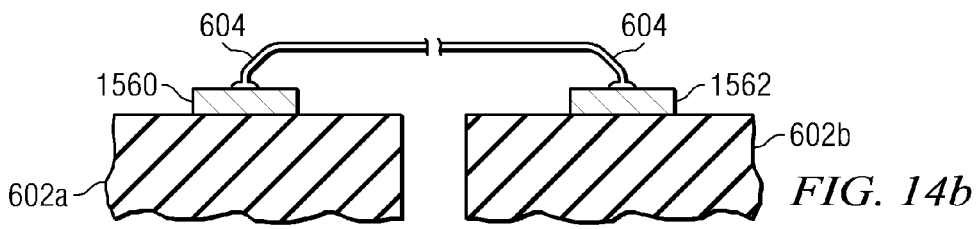
FIG. 14b illustrates a side view of a bond wire.

Referring now to FIG. 14b, there is illustrated a side view of one of the bond wires 604. It can be seen that the substrate associated with the die 602a has disposed thereon a bonding pad 1560 and the die 602b has disposed thereon a bonding pad 1562. The bond wire 604 is bonded to the pad 1516 on one side with a conventional bond and also to the pad 1562 on the die 602b. The length of the bond wire 604 is a fraction of a wavelength at the 1.0 GHz frequency. However, it will be inductive in nature and will have distributed inductance and capacitance associated therewith. As such, the transmission characteristics of the bond wire can affect the transmission of information between the two dies 602a and 602b. As noted herein above, the input impedance to each of the pads 1560 is on the range of 500 ohms. Thus, for ideal transmission of the information, there might be some matching circuitry required in addition to just the bond wires 604 forming the two-wire transmission line, although that has not been set forth herein.

Figure 15:
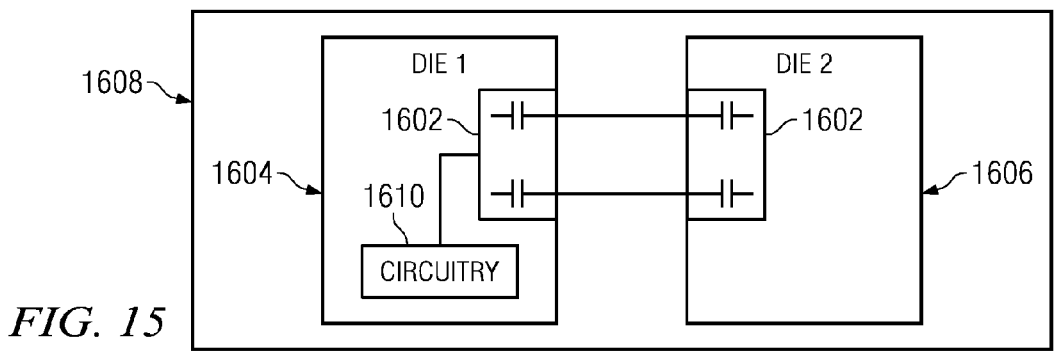
FIG. 15 illustrates an integrated capacitive isolation link in a single package including two dies.

Referring now to FIG. 15, there is illustrated the manner in which the capacitive isolation link 600 represented as capacitive isolation circuitry 1602 may be integrated into two separate multi-functional dies, 1604 and 1606, within a single package 1608. The capacitive isolation circuitry 1602 may provide isolation between components on two separate dies 1604 and 1606. Associated with one or both of the dies could be additional circuitry 1610 such as a microcontroller or other electronic component. This additional circuitry would be isolated from components in the other die via the capacitive isolation link 1602.

Figure 15A:
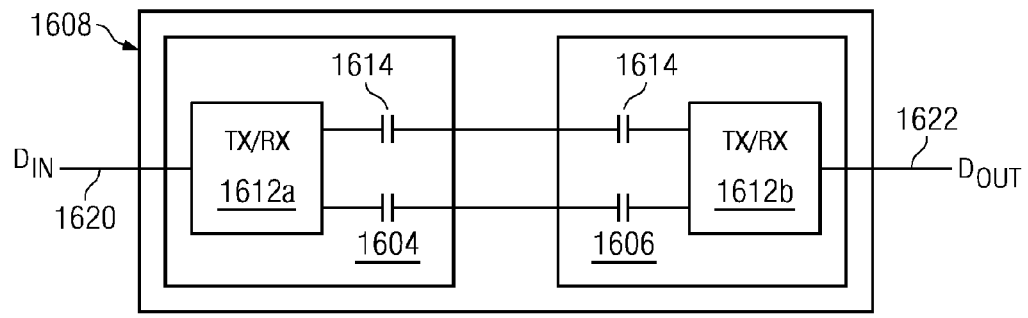
FIG. 15a illustrates an integrated capacitive isolation link in a single package having a digital input and a digital output.

Referring now also to FIG. 15a, when a capacitive isolation link 600 is integrated onto two separate dies 1604 and 1606 in a single package 1608. The isolation interface 1602, which includes the transceivers 1612 and the capacitors 1614, may be used to provide simply a digital IN, digital OUT package 1608. In this embodiment, the digital input 1620 is applied to a first transceiver 1612a. Alternatively, the digital input 1620 could be applied to digital circuitry connected to the transceiver 1612a. The isolation circuit operates in the manner described herein above and a second digital output 1622 is provided from transceiver 1612b or associated digital circuitry.

Figure 15B:
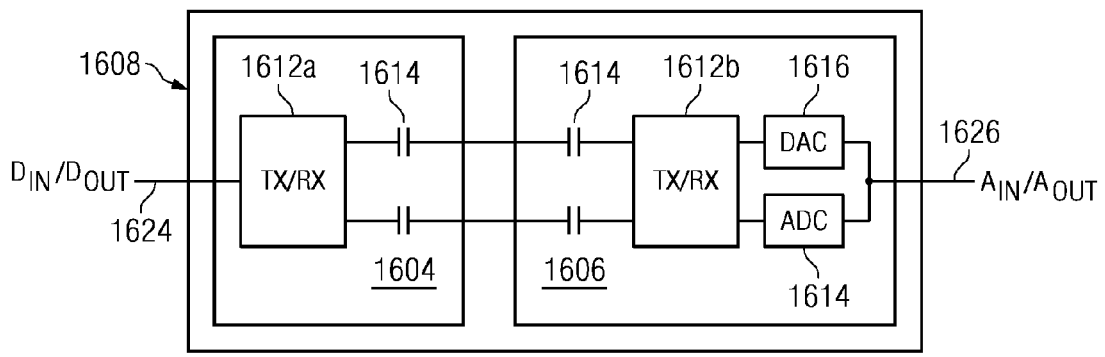
FIG. 15b illustrates an integrated capacitive isolation link in a single package including a digital input/output and an analog input/output.

Referring now to FIG. 15b, rather than providing a solely digital input/digital output circuit, a single package 1608, including first and second dies 1604, 1606 implementing the capacitive isolation circuit described herein above, may provide a circuit with a digital input/output and an analog input/output. In this case, a digital input/output 1924 would connect with transceiver 1612a or digital circuitry of a first die 1604. The first die 1604 is coupled with the second die 1606 via the described capacitive isolation link, and the transceiver 1612b is coupled to an analog input/analog output 1626 through a data converter, either an ADC 1614 or a DAC 1616, depending upon the direction.

Figure 15C:
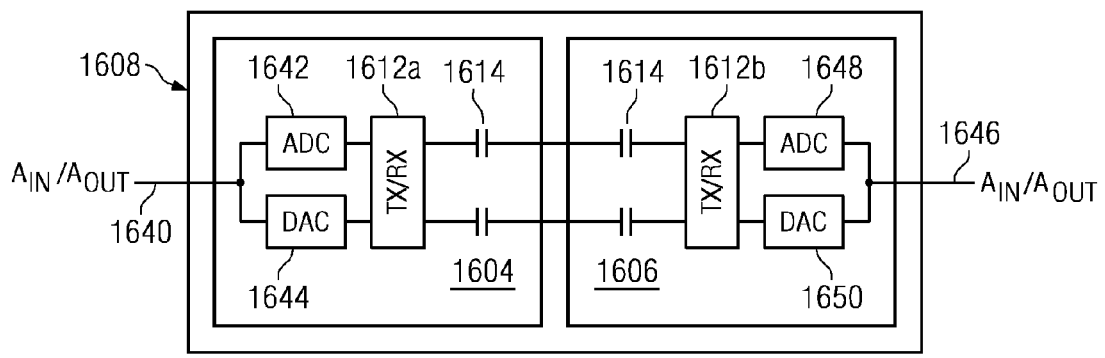
FIG. 15c illustrates an integrated capacitive isolation link in a single package including an analog input/output and an analog input/output.

Referring now to FIG. 15c, a single package 1908, including first and second dies 1604, 1606 implementing the RF isolation circuit described herein above, may provide a circuit with an analog input/output and on one side and an analog input/output on the other side. In this case, an analog input/output 1640 would connect to an A-D converter 1642 and a D-A converter 1644 and then to the transceiver 1612a or digital circuitry of a first die 1604. The first die 1604 is coupled with the second die 1606 via the described RF isolation link, and the transceiver 1612b is coupled to an analog input/output 1646 via an A-D converter 1648 and D-A converter 1650. In this way, analog signals may be transmitted in either direction across the single package 1608.

Figure 16A:
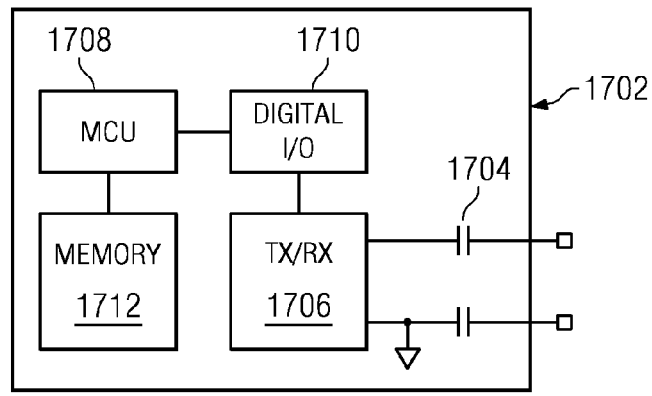
FIG. 16a illustrates a capacitive isolation link integrated with a microcontroller.

Referring now to FIG. 16a, there is illustrated a chip 1702 including a portion of the capacitive isolation link described herein above. The chip 2002 includes a capacitive link 1704 and the transmit and receive circuitry 1706 of the capacitive isolation link 600. The capacitive isolation link 600 consisting of the transceiver 1706 and the capacitive link 1704 is integrated with a microcontroller unit 1708 through a digital input/output 1710. A memory 1712 stores operating instructions and data needed by the microcontroller unit 1708. The chip 1702 would be able to interconnect with a second chip that included an interface consisting of a capacitive link 1704 and transceiver 1706 similar to that included within the chip 1702. By interconnecting to such chips, the microcontroller 1708 and the interconnected chip would be voltage isolated from each other via the complete capacitive isolation link between them.

Figure 17:
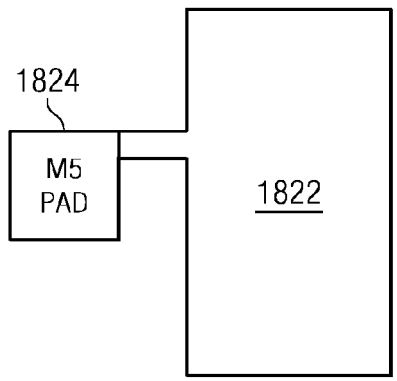
FIG. 17 illustrates a structure of one plate of a capacitor in an integrated circuit.

The transmit and receive circuitry 1706 is part of the I/O interface for the integrated circuit. One type of integrated circuit that provides the overall functionality of that illustrated in FIG. 17 is a conventional microcontroller unit of the type C8051FXXX, manufactured by the Silabs, Inc. This chip provides onboard processing through the MCU 1708, interface to the analog domain and interface to the digital domain. This integrated circuit also has the ability to configure the various outputs and, as such, a digital output could be provided on a serial interface for driving the transmit/receive circuitry 1706 or receiving the serial data therefrom.

The process of fabricating the MCU 1708, memory 2012 and the digital I/O 1710, in addition to the various analog-to-digital data converters or digital-to-analog data converters is fairly complex. As such, the transmit and receive circuitry 1706 and the capacitive link 1704 must be compatible with the process rather than making the process compatible with the capacitive link. As will be described herein below, there are a plurality of metal layers utilized to fabricate various interconnects associated with fabrication of the integrated circuit. By utilizing the various metal layers that are already present in the fabrication process, the two sides of the capacitive link 1704 can be fabricated and isolated from one another with sufficient isolation to provide adequate over voltage protection.

Figure 16B:
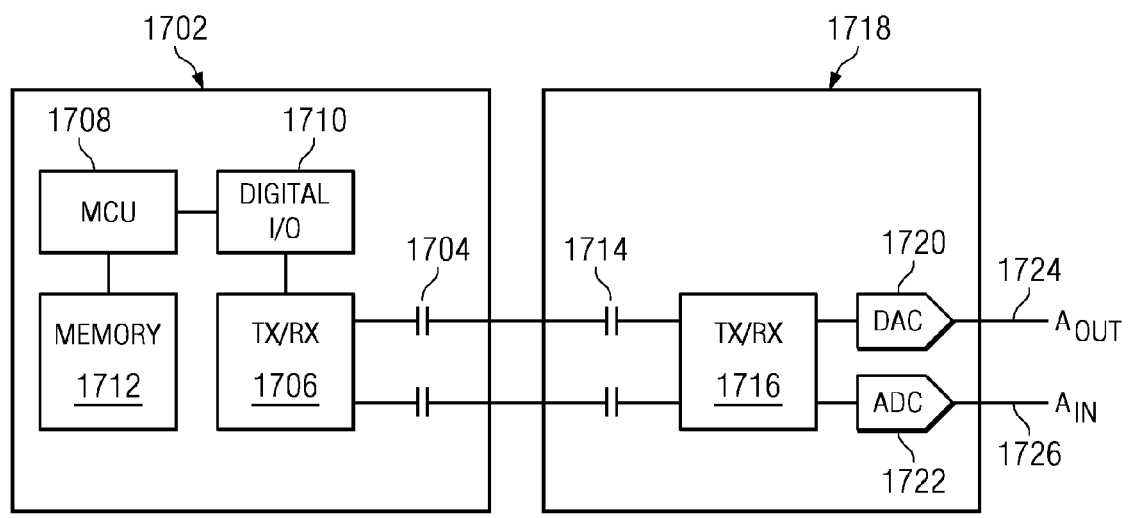
FIG. 16b illustrates the capacitive isolation link integrated with a microcontroller interconnected to a second chip providing both analog input and analog output.

One example of this is illustrated in FIG. 16b, wherein the chip 1702 including an capacitive isolation link consisting of capacitors 1704 and transceiver 1706 is integrated with a microcontroller unit 1708 through a digital input/output 1710. The MCU 1708 also includes an associated memory 1712. In this case, the first portion of the capacitive isolation link consisting of a capacitors 1704 and transceiver 1706 is interconnected with a second portion of the capacitive isolation link consisting of capacitors 1714 and transceiver 1716. In this case, the chip 1718 including the second portion of the capacitive isolation link includes a digital-to-analog converter 1720 and an analog-to-digital converter 1722 for converting the digital output of the transceiver 1716 of the capacitive isolation link into an analog output and for converting received analog inputs into digital inputs. The chip 1718 enables both the output of an analog signal at analog output 1724 and the input of analog signals at analog input 1726. These analog signals may then be used in any desired fashion by a circuit designer.

Figure 18:
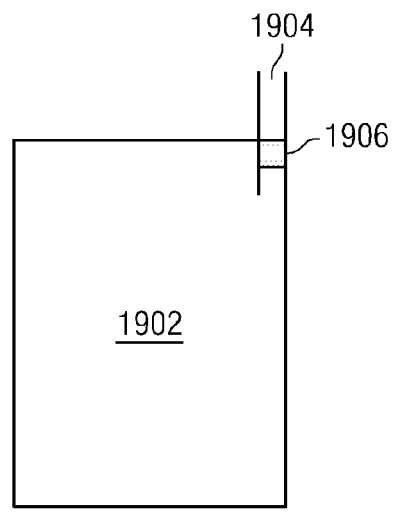
FIG. 18 illustrates a structure of a second plate of a capacitor in the integrated circuit.

Referring now to FIGS. 17, 18, 19a and 19b, there is illustrated the structure of the capacitors of the capacitive isolation link integrally formed on a CMOS device. Each plate of the capacitor is integrated as part of one of the chips or dies including the capacitive isolation link. Referring more particularly to FIGS. 17 and 18, there are illustrated the plates forming each plate of a capacitor included within the capacitive link. A first plate 1822 is formed within the fifth metal layer of a chip referred to as the "metal five" or "M5" layer. The plate 1822 is connected with a pad 1824 located on the metal five layer.

Referring now to FIG. 18, there is illustrated the components of the second plate of a capacitor of the capacitive link wherein a second plate 1902 is used to form the second plate of the capacitor. The plate 1902 is located on the second metal layer of a chip referred to as the "metal two" or "M2" layer. The metal layers are conductive layers of the substrate. The plate 1902 is interconnected to plate 1904 within the metal five layer through a conductive via 1906. Each of the capacitors included within the capacitive isolation link are constructed in a similar manner.

Figure 19A:
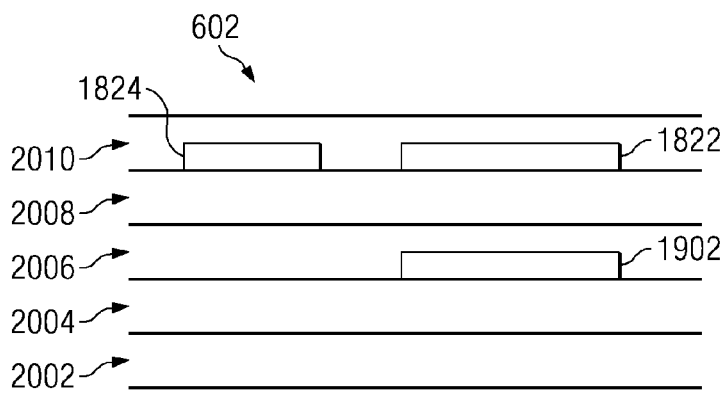
FIG. 19a illustrates a side view of the capacitor structure with the integrated circuit.

Referring now to FIG. 19a, there is illustrated a side view of a chip 602 containing a capacitor structure as described with respect to FIGS. 17 and 18. The chip 602 includes a substrate layer 2002 containing the transceiver circuitry of the capacitive isolation link and any electronic circuitry integrated with the capacitive isolation link as discussed previously. The metal one layer 2004 resides upon the substrate 2002. On top of the metal one layer is the metal two layer 2006 containing the capacitor plate 902 interconnected by vias to the terminals 1904 (not shown) in the metal five layer 2010. The metal five layer 2010 resides over the metal two layer 206. The metal five layer 2010 contains the other portion of the capacitor, including the bond pad 1824 and the second plate 1822 of the capacitor. The metal one layer 2004 is utilized primarily to provide interconnects to the remaining circuits. However, the process uses all five metal layers for the various interconnects. For the purposes of over-voltage protection, it is desirable to separate the plates of the capacitors represented by plates 1902 and 1822 by as much distance as possible; realizing that the material disposed therebetween is silicon dioxide, a dielectric. In an alternative embodiment the plate 1822 could be placed below the pad 1824 or alternative the plate 1822 could act as both the plate of the capacitor and as the pad 1824.

Figure 19B:
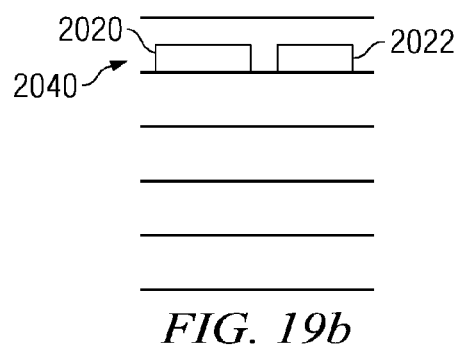
FIG. 19b illustrates a side view of a horizontal capacitor structure.

FIG. 19b illustrates a side view of a horizontal capacitor. The horizontal capacitor consists of a first plate 2020 and a second plate 2022 that are each on the same layer 2040 of the integrated circuit. This type of capacitor may also be used in the capacitive isolation link. Alternatively, a combination of horizontal and vertical capacitors (FIG. 19a) may be used.

Figure 20:
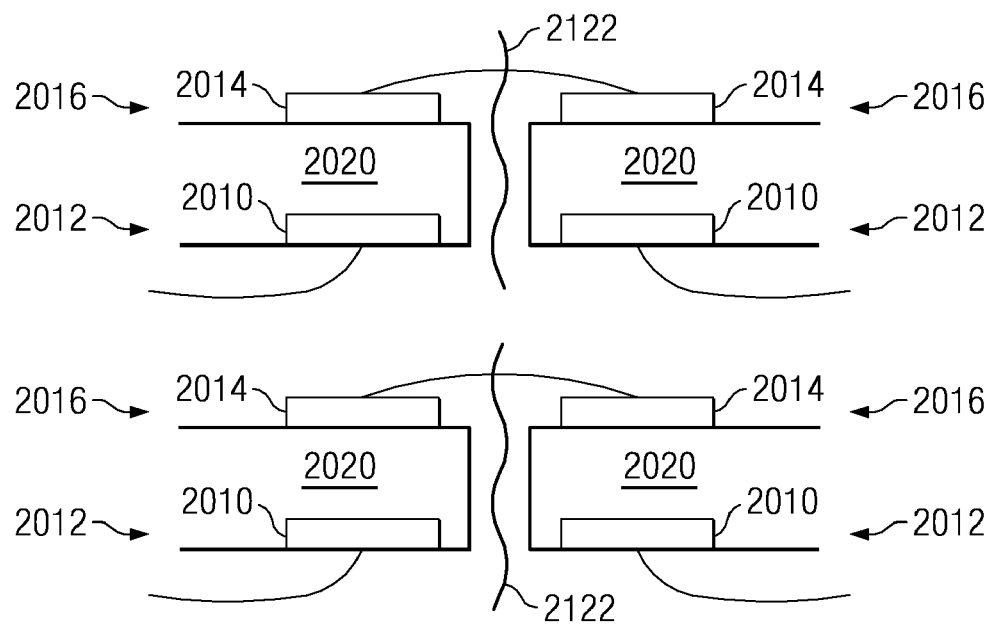
FIG. 20 illustrates a side view of the capacitor isolator link in the integrated circuit.

Referring now to FIG. 20, there is illustrated a side view of the various capacitors within the capacitive isolation link. The capacitors comprise a first plate 2010 within a metal five layer 2012 and a second plate 2014 within a metal two layer 2016. The first plates 2010 and second plates 2014 are separated by a dielectric layer 2020. Each pair of capacitors associated with one side of the capacitive isolation connection may be located in a same die or in separate dies separated at line 2122. In either case, the break down voltage across the set of each pair of capacitors in series is divided across each capacitor in the series connected pair. Thus, for a total voltage of 5,000 volts, a total of 2,500 volts would be distributed across each of the capacitors.

Figure 21:
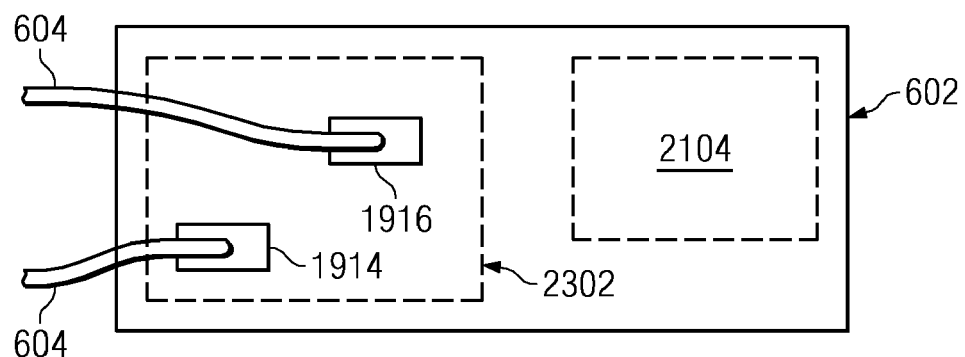
FIG. 21 illustrates a chip including a capacitive isolation link.

Referring now to FIG. 21, there is illustrated a chip 602 including a capacitive isolation link according to the present disclosure. The area of the chip 602 would be divided into at least two sections. A first section 2102 would contain the circuitry for providing the capacitor for electromagnetically coupling with a capacitor on another chip to provide the voltage isolation link between the chips. The remaining electronic circuitry of the chip would be located in a separate area 2104 and would include the transmitter and receiver circuitry of the voltage isolation link associated with the capacitor as well as any electronic circuitry that would be integrated with the voltage isolation link, such as a microcontroller or other type of electronic device. This would be repeated for multiple voltage isolation links for additional data paths.

The following description with respect to FIGS. 22-31 provides an illustration of another embodiment of the capacitive isolator. Referring now to FIG. 22a, there are illustrated three channels of a capacitive isolation circuit. Each channel 2202 includes a differential transmitter 2204 and a differential receiver 2206. Each transmitter 2204 is connected with a receiver 2206 via a pair of lines including the capacitive isolation link 2208 described herein. Each capacitive isolation link 2208 includes two separate lines 2210 and 2212. When data is being transmitted on isolation channel 2202a, the signal on lines 2210a and 2212a will be 180 degrees out of phase with each other. The signal on line 2210a is represented generally at 2214 and the information on line 2212a is represented generally at 2216. Similarly, if information is being transmitted on channel 2202c the signals are 180 degrees out of phase with each other on lines 2210c and 2212c. The information is represented generally at 2218 that is being transmitted on line 2210c and the information being transmitted on line 2212c is represented generally at 2220.

Figure 22A:
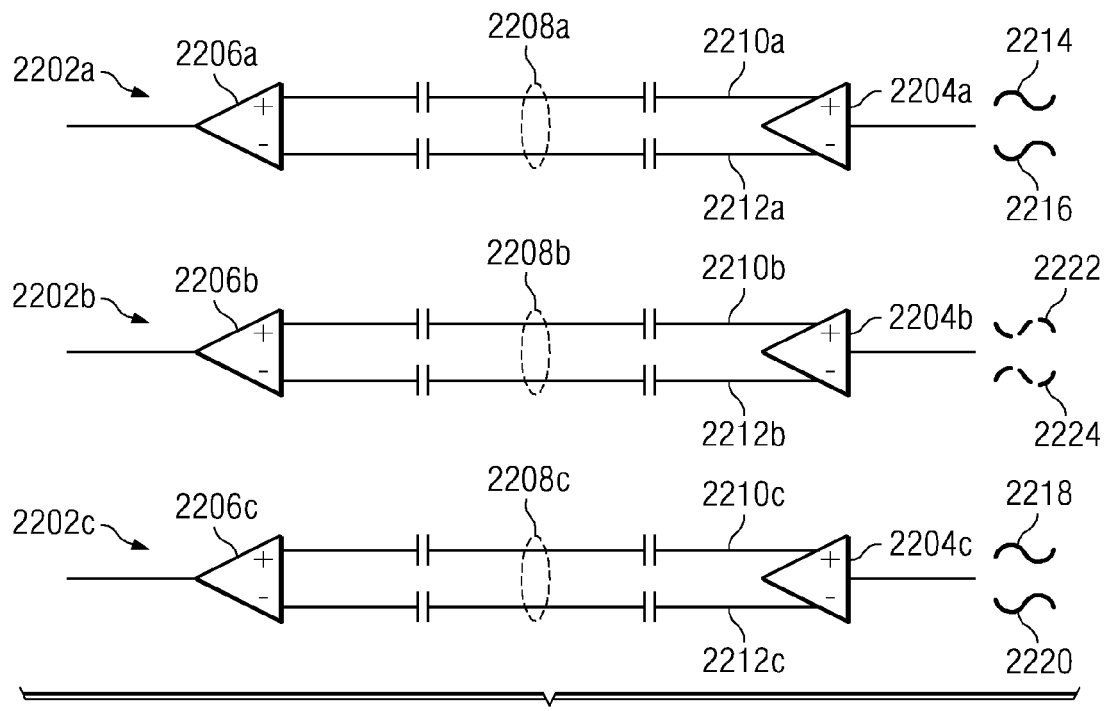
FIG. 22a illustrates multiple adjacent isolator links.

Due to the fact that the channels 2202 are directly adjacent to each other within the circuit, cross coupling is a concern within the capacitive isolation link. Previous methods for improving cross coupling involved increasing the area of the circuit to increase spacing between lines and thus limit cross coupling. However, this works against the desire for limiting the size of the circuitry. Rather than increasing the size of the circuitry, a phase control scheme may be implemented as described in FIG. 22b. As illustrated in FIG. 22a, the cross coupling effect will couple the signal from line 2212a onto line 2210b as illustrated generally at 2222. Similarly, the signal 2218 on line 2210c is coupled onto line 2212b as signal 2224. This provides an output signal from the differential receiver 2206b that would have twice the amplitude of the coupled signals on each of lines 2210b and 2212c. If no signal is actually being transmitted at the time on channel 2202b the coupled signals could cause an undesired signal at the output of the differential receiver 2202d. If a signal is being transmitted, the coupled signals would cause interference with the signal actually being transmitted.

Figure 22B:
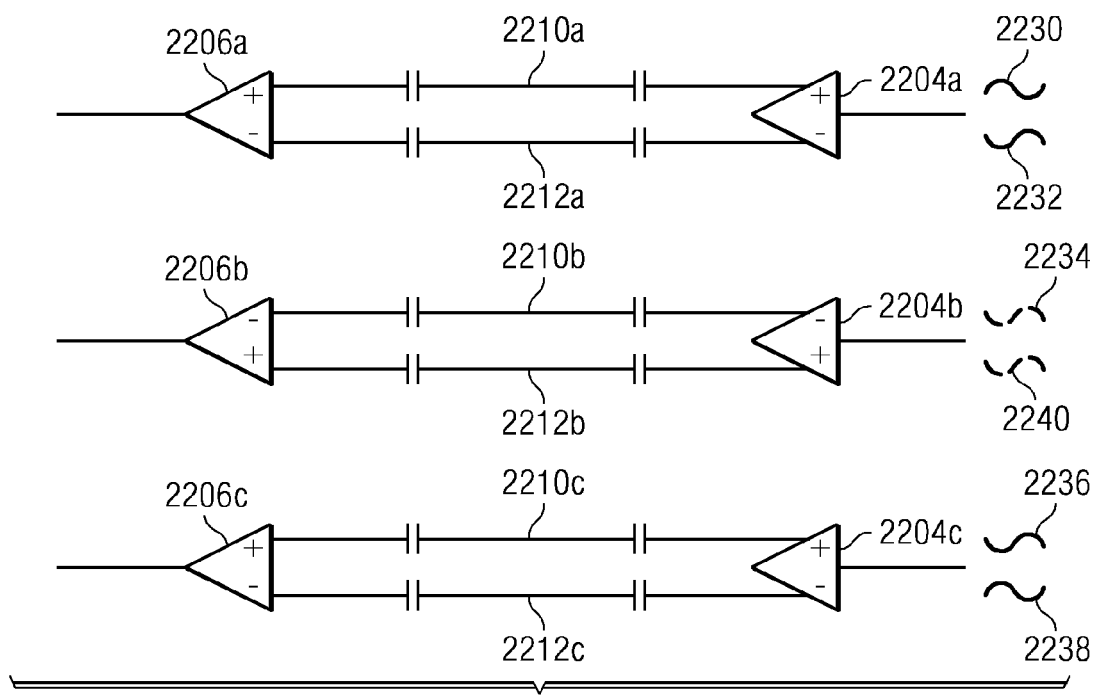
FIG. 22b illustrates the manner in which phase control may be used between adjacent isolation links to correct for adjacent channel cross coupling.

This problem may be overcome, as illustrated in FIG. 22b, by controlling the lines on which the phase signals generated at the differential transmitter 2204 are transmitted. Thus, as illustrated in FIG. 22b, the differential transmitter 2204a transmits the signals 2230 and 2232 as illustrated on each of lines 2210a and 2212a, respectively. The signal on line 2212a is coupled with line 2210b as signal 2234. Similarly, signal 2236 is transmitted from the differential transmitter 2204c on line 2210c, and signal 2238 is transmitted from the differential transmitter 2204c on line 2212c. Line 2210c couples with line 2212b, and the signal 2236 is coupled onto line 2212b. This provides the coupled signal 2240 on line 2212b. When lines 2210b and 2212b are added together at the differential receiver 2206b, the signals cancel each other out and a receive signal that is not actually transmitted or distorted by the coupled signals is not generated on channel 2202. Thus, by controlling the phases provided from the transmitters 2204a and 2204c, the phases may be established such that the signals coupled onto lines 2210b and 2212b will effectively cancel each other out rather than creating a false coupled signal at the output of the differential receiver 2206b.

Referring now also to FIG. 22c, in an alternative embodiment, rather than controlling the phase of the signals transmitted from the differential transceiver 2204 on lines 2210 and 2212. A dummy wire 2250 may be included between each of the isolation channels 2202. Thus, rather than line 2212 coupling signals onto line 2210 and line 2210 coupling signals onto line 2212, the lines 2210 and 2212 each couple with the dummy wire 2250 which is connected to ground. This causes the coupled signals to be grounded, and thus do not affect the operation of an adjacent channel. Therefore, the problems of cross coupling between adjacent isolation channels may be eliminated without requiring an area increase in the design of the circuit. Control of the phases of the differential transmitters and receivers and/or the use of the grounded dummy wires provide a solution enabling the size of the circuitry to be maintained.

Referring now to FIG. 22d, there is illustrated a layout for the two separate galvanically isolated die. In FIG. 22d, the dies are illustrated with reference numerals 2260 and 2262. Each of the die have a plurality of capacitors 2264 disposed on one edge thereof. The capacitors 2264 are sized to couple RF energy at the frequency of the on-board oscillator which, in this particular embodiment, is operated at a frequency of approximately 700 MHz. Since this is not an inductor, the capacitor will not act as a band pass filter. However, as will be described herein below, there is typically a shunt resistor such that the capacitor and the resistor will act as a high pass filter such that the value of the capacitor and the value of the resistor determine the corner frequency of the frequency response. By adjusting these values, the corner frequency of the high pass filter can be varied.

The size of the capacitors 2264 on the edge of each of the die 2260 and 2262 are sized, as described herein above, to provide the appropriate capacitive value, which is a function of the thickness of the dielectric between the middle layers M5 and M2. Also, they are spaced from each other the minimum distance possible to minimize the amount of cross coupling. As noted herein above, the phase of the signals is also counted for to minimize cross coupling. It is noted that the capacitors 2264 are illustrated such that only the top plates of these capacitors are viewable. The top plates will couple to each other such that there is a series capacitance between the two top plates which provide a capacitance that is a function of the side wall surface area on the top plate, the dielectric disposed therebetween and the distance between the two. However, the capacitance will be a series capacitance between the two adjacent top plate of capacitors 2264 and the capacitance from the adjacent top plate to ground through the associated lower plate (not shown). This, of course, depends upon what voltage the particular plates are disposed at and how much signal is coupled therethrough. In any event, it is desirable to dispose the top plates of capacitors 2264 as close together as possible. Thereafter, there is provided a bond wire 2266 between corresponding capacitors 2264 and each of the dies 2260 and 2262. As noted herein above, these two dies 2260 and 2262 are galvanically isolated and such facilitated by disposing the two dies 2260 and 2262 on separate lead frames 2268 and 2270, the entire system then packaged in a conventional package. By disposing the top points of the capacitors 2264 as close together as possible, this will also mean that the bond wires 2266 will be disposed as close together as possible. This will facilitate a smaller die size in a smaller package, but the possibility for cross coupling will increase. This has been solved utilizing the embodiment described above with respect to FIG. 22b.

Referring now to FIG. 23, there is illustrated a manner for merging a top plate 302 of a capacitor with a bonding pad to save area upon the capacitive isolation circuit. A connection between an on-chip capacitor to a bonding pad always causes signal loss within the circuit and requires a larger area in order to be configured within the device. This causes higher power requirements within the circuitry. The implementation illustrated in FIG. 23 integrates the connection between the bonding pad and the top plate 2302 of the capacitor. The capacitor consists of the top plate 2302 which is included within, for example, the metal five (M5) layer of the integrated circuit. The lower plate 2304 of the capacitor is included within the metal two (M2) layer of the integrated circuit. Rather than creating a bonding pad that requires signal lines to be run from the metal five layer top plate 2302 to the bonding pad, the bonding wire 2306 is connected directly with the top plate 2302 of the capacitor rather than to the bond pad. In order to accomplish this, the bonding wire 2306 is directly connected to a connection 2308 within an upper level metal layer such as the metal layer six (M6). This upper level connection 2308 is directly connected to the top plate 2302 of the capacitor on the metal five layer through a plurality of conductive vias 2310. This configuration eliminates the signal losses occurring in a wire connection between the top level capacitor plate 2302 and a bonding pad on the integrated circuit.

Figure 24:
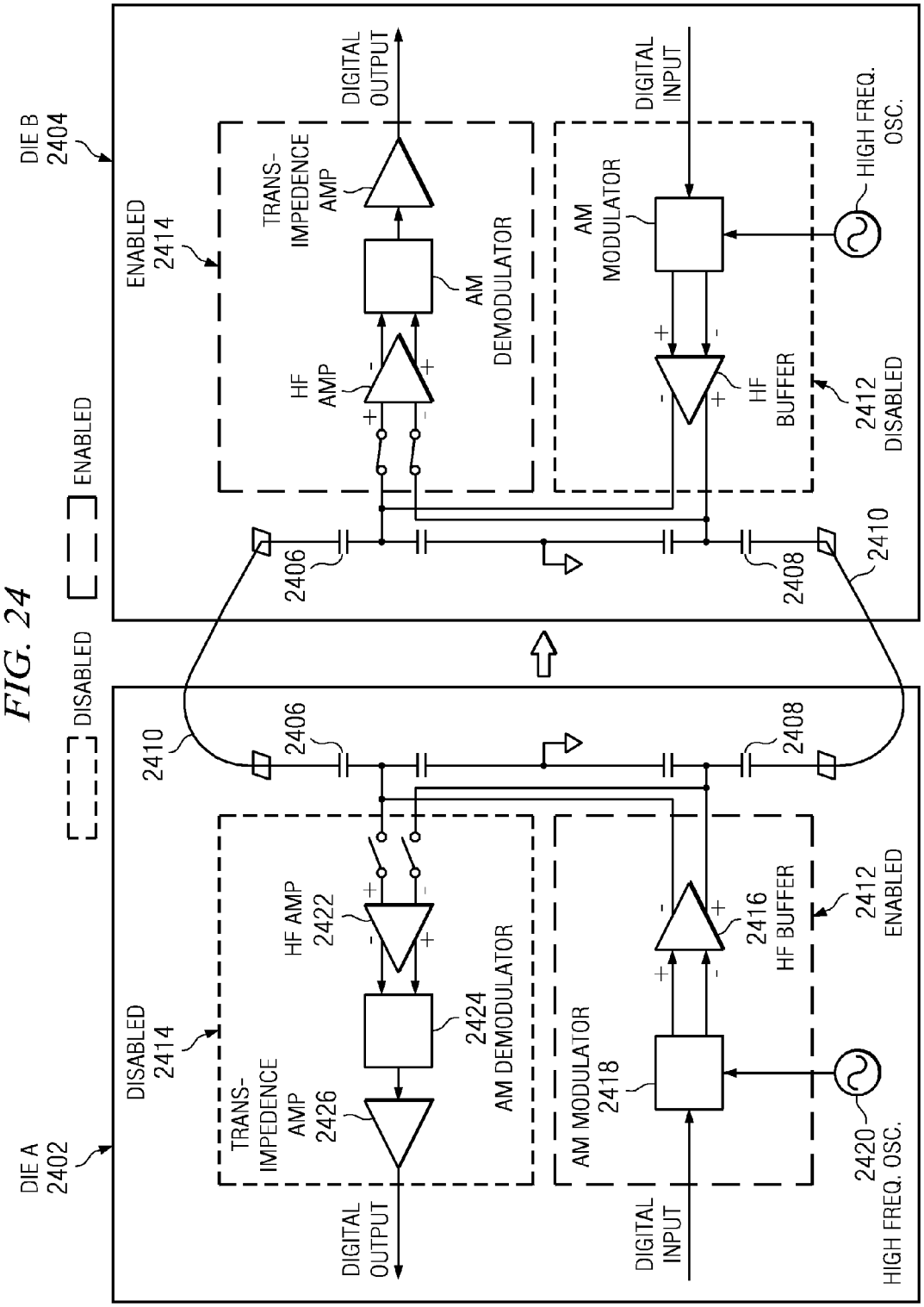
FIG. 24 illustrates the manner for controlling communications through a capacitive isolation layer between a transmit and receive side.
Figure 25A:
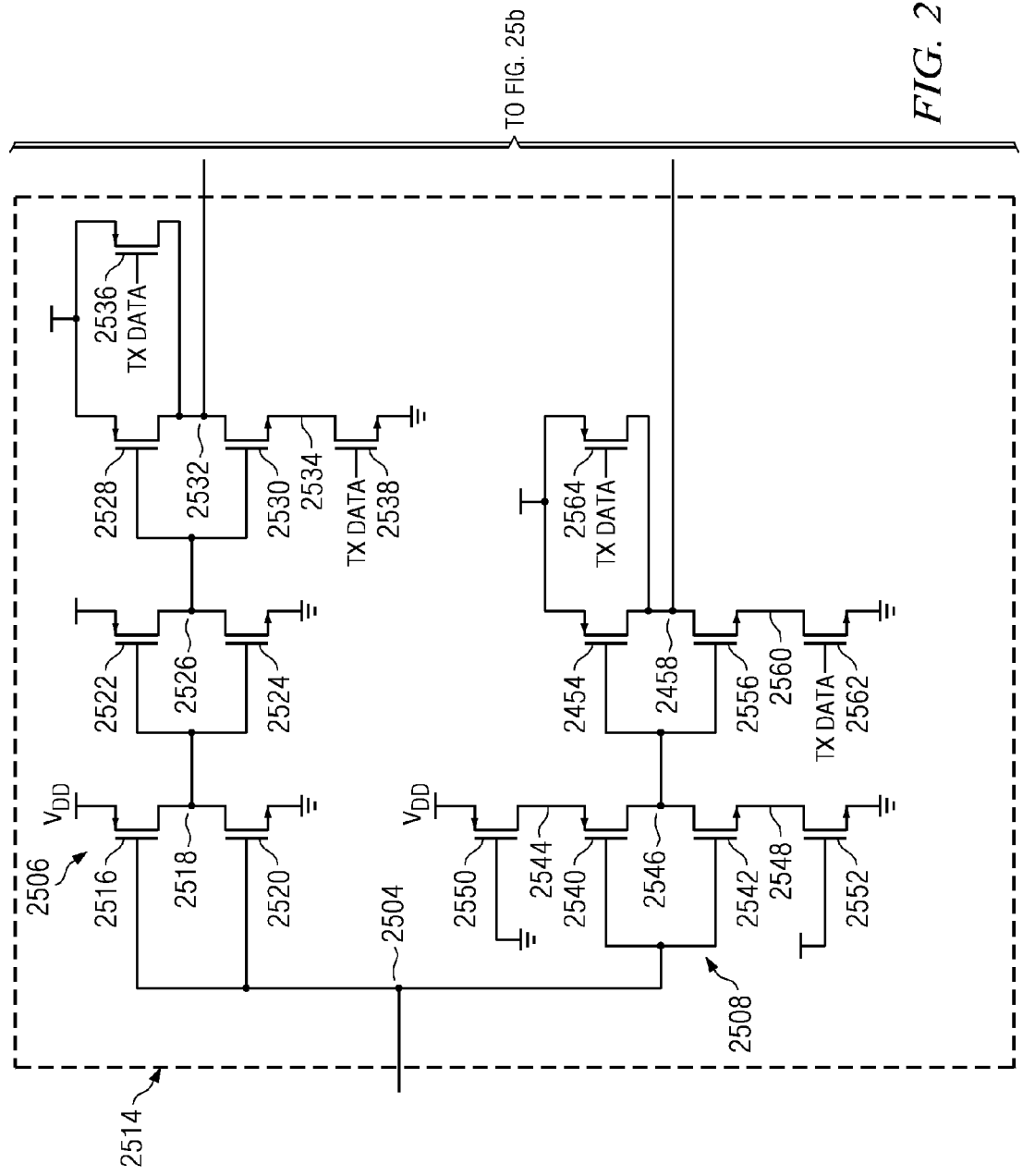
FIGS. 25a and 25b are schematic diagrams of the transmitter circuitry of the capacitive isolation link.
Figure 25B:
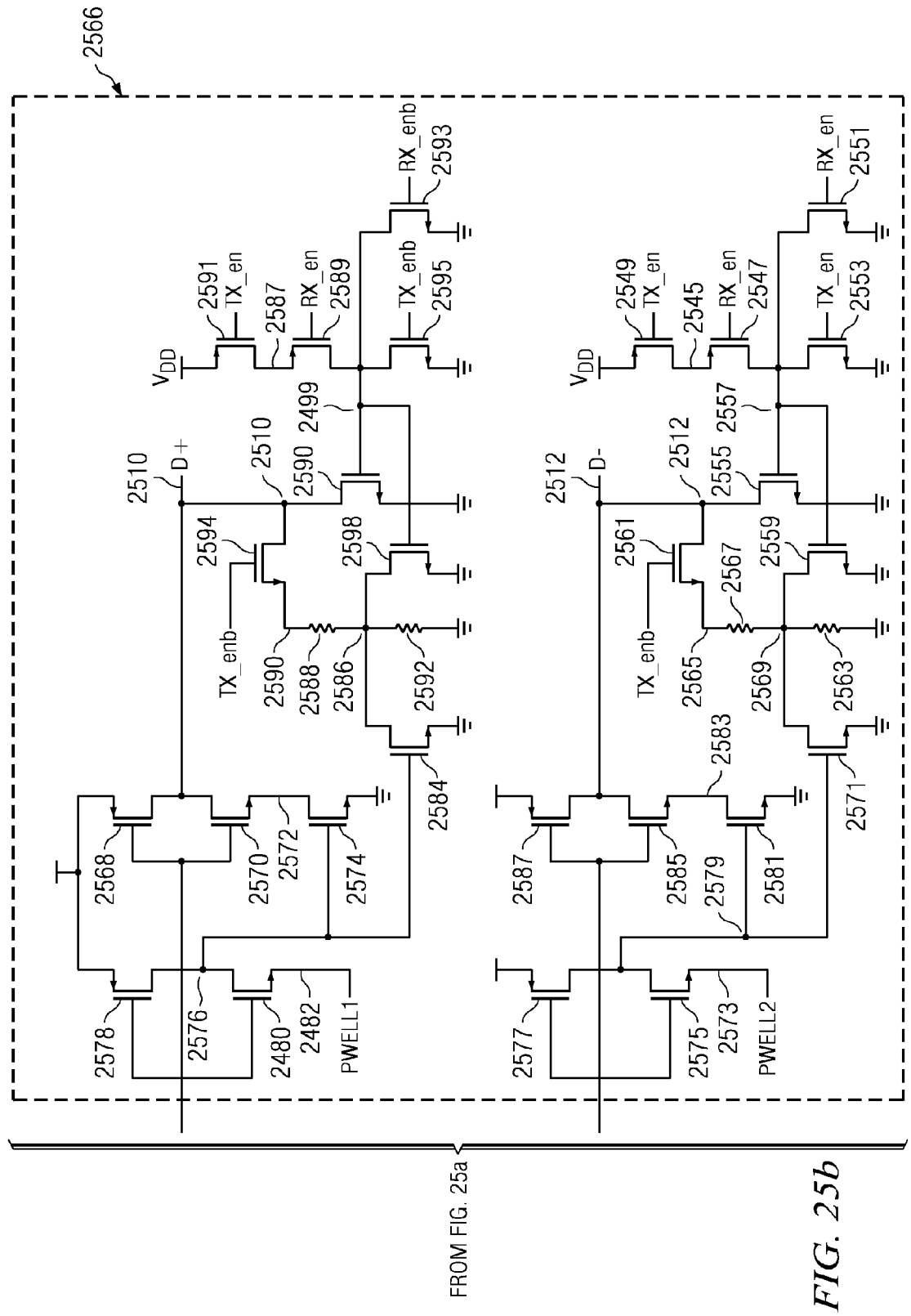

Referring now to FIG. 24, there is provided a functional block diagram illustrating the capacitive isolation link between a first die 2402 and a second die 2404. The capacitive isolation link, as described previously herein, consists of a first connection consisting of a pair of capacitors 2406. A second connection is provided via a pair of capacitors 2408.

The capacitors 2406 and 2408 on each of the first die 2402 and second die 2404 are connected via a pair of bond wires 2410. Each die includes a transmission circuit 2412 and a receiver circuit 2414. When transmissions are occurring over the capacitive isolation link, a transmitter circuit 2412 on one die is enabled while the receiver 2414 disabled. On the other die, the receiver circuit 2414 is enabled while the transmitter circuitry 2412 is disabled. When transmitting in the other direction, the disablement and enablement of the transmitters and receivers is reversed. The transmitter circuit 2412 consists of a differential amplifier 2416 that receives a modulated AM signal from an AM modulator 2418 that is generated responsive to a digital input and a high frequency oscillator signal 2420. The receiver circuitry 2414 consists of a differential receiver 2422 that provides the receive signal to an AM demodulator 2424 to generate the output data which is then amplified via a transimpedance amplifier 2426.

In operation, the transmission path from one die to another through the capacitive link, i.e., the bond wire 2410, forms a high pass filter. For example, the transmission path from the transmitter 2413 drives the receiver 2414 through the capacitor pair 2408 through the bond wire 2410. Each of the receivers 2414 have switches on the input to the amplifier, each receiver comprised of a high frequency amplifier, a de-modulator and a transimpedance amplifier. The differential receiver input is switched into interface with the capacitors 2406 and 2408 on the respective differential inputs during reception and, when the particular die is in the transmit mode, the switches are open. Although not shown, on the input of each of the high frequency amplifiers on the receiver is provided a resistor that is shunted to ground. This particular resistor is provided for the purpose of forming a high pass filter across the galvanic barrier. This is utilized to filter out any harmonics (unwanted signals) due to transients. As compared to an inductive based RF link, the capacitive link isolator does not have the bandwidth properties that are inherent in the inductive coupling. As such, low frequency harmonics associated with any kind of large transient would be coupled through to the other side. By selecting the corner frequency of the series capacitance and shunt resistor and the respective values thereof, this corner frequency can be selected so as to reject substantially all harmonics (unwanted signals) that are below the fundamental frequency of the oscillator 2420. This will be described in more detail herein. below Referring now to FIGS. 25a and 25b there are illustrated schematic diagrams of the differential transmitter for transmitting information over the capacitive isolation link. The transmitter receives modulated signal at an input node 2504. The modulated signal goes through a first transmitter branch 2506 and a second transmitter branch 2508 that ultimately provides the differential outputs at the output nodes 2510 and 2512 respectively. The branches 2506 and 2508 provide the transmitted data 180° apart from each other. The first portion of each of branches 2506 and 2508 consists of driver circuitry 2514 for driving the input data modulated signals. The upper driver circuitry consists of a transistor 2516 having its source/drain path connected between $V_{DD}$ and node 2518. A transistor 2520 is connected between node 2518 and ground. The gates of each of transistors 2516 and 2518 are connected to the input node 2504. The RF signals are provided at node 2504. A second pair of transistors consisting of transistor 2522 and transistor 2524 have their gates connected to node 2518. The drain/source path of transistor 2522 is connected between $V_{DD}$ and node 2526. The drain/source path of transistor 2524 is connected between node 2526 and ground.

Node 2526 is connected to the gate of transistors 2528 and 2530. Transistor 2528 has its source/drain path connected between $V_{DD}$ and node 2532. Transistor 2530 has its drain/source path connected between node 2532 and node 2534. The data to be transmitted by the driver circuitry 2514 is applied to transistors 2536 and 2538. The source/drain path of transistor 2536 is connected between $V_{DD}$ and node 2532 in parallel with transistor 2528. Transistor 2538 is connected between node 2534 and ground. The digital data value to be transmitted is applied at the gates of each of transistors 2536 and transistor 2538. When a logical "1" is applied to the gates of transistors 2536 and 2538, this enables the amplitude modulated signal applied at node 2504 to be passed through at node 2532.

The lower branch 2508 of the driver circuitry 2514 includes a pair of transistors 2540 and 2542 having their gates connected to receive the amplitude modulated signal at node 2505. The source/drain path of transistor 2540 is connected to node 2544 and node 2546. The drain/source path of transistor 2542 is connected between node 2546 and node 2548. A transistor 2550 has its source/drain path connected between $V_{DD}$ and node 2544. The gate of transistor 2550 is connected to ground. A transistor 2552 has its drain/source path connected between node 2548 and ground and the gate of transistor 2552 is connected to $V_{DD}$. Node 2546 is connected to the gates of transistors 2554 and 2556. Transistor 2554 has its source/drain path connected between $V_{DD}$ and node 2558. Transistor 2556 has its drain/source path connected between node 2558 and node 2560. Transistor 2562 has its drain/source path connected between node 2560 and ground and its gate connected to receive the transmit data information. Transistor 2564 has its source/drain path connected between $V_{DD}$ and node 2558 and its gate is also connected to receive the transmit data signal.

The output of the upper branch driver 2506 and lower branch driver 2508 goes to the biasing circuit for the transmit/receive switch 2566. Within the upper branch 2506 the gates of transistors 2568 and 2570 are connected to node 2532. The source/drain path of transistor 2568 is connected between $V_{DD}$ and the V+ output node 2510. Transistor 2570 has its drain/source path connected between the V+ phase output node 2510 and node 2572. A transistor 2574 has its drain/source path connected between node 2572 and ground. The gate of transistor 2574 is connected to node 2576 between transistors 2578 and 2580. Transistor 2578 has its source/drain path connected between $V_{DD}$ and node 2576. Transistor 2580 has its source/drain path connected between node 2576 and node 2582. Node 2582 is connected to pwell 1. Pwell 1 is connecting to the bulk of transistor 2574. When transmitter 2574 is off, node 2476 is at same voltage pwell 1 and makes the gate of transistor 2574 connect to pwell 1 (the gate and bulk of transistor 2574 are at the same voltage), then the drain of transistor 2574 will be 2Vt lower than the ground when there is common mode current without turning off the transistor 2574. If node 2582 were connected to ground, the voltage will only be 2 diode and 1Vt lower than ground, which will limit the signal level at the receiver. A transistor 2584 has its source/drain path connected between node 2586 and ground. A resistor 2588 is connected between node 2590 and node 2586 and a resistor 2592 is connected between node 2586 and ground.

A transistor 2594 has its gate connected to receive the transmit enable signal and has its source/drain path connected between node 2510 and node 2590. A transistor 2598 has its drain/source path connected between node 2586 and ground. The gate of transistor 2598 is connected to node 2599. Node 2599 is also connected to the gate of a transistor 2597. The transistor 2597 has its drain/source path connected between node 2510 and ground. A transistor 2595 has its drain/source path connected between node 2599 and ground. The gate of transistor 2595 is connected to receive the transmit enable signal. A transistor 2593 is also connected between node 2599 and ground. The gate of transistor 2593 is connected to receive the receive enable signal. A pair of transistors 2591 and 2589 is connected between $V_{DD}$ and node 2599. Transistor 2591 has its source/drain path connected between the $V_{DD}$ node and node 2587. The gate of transistor 2591 is connected to receive the transmit enable signal. Transistor 2589 has its source/drain path connected between node 2587 and node 2599. The gate of transistor 2589 is connected to receive the receive enable signal.

The lower branch biasing circuit and transmit receive switch of the transmitter is configured in a similar manner as the upper branch portion of the circuit. Within the lower branch 2508, the gates of transistors 2587 and 2585 are connected to node 2458. The source/drain path of transistor 2587 is connected between $V_{DD}$ and the V− output node 2412. Transistor 2585 has its drain/source path connected between the V− phase output node 2412 and node 2583. A transistor 2581 has its drain/source path connected between node 2583 and ground. The gate of transistor 2581 is connected to node 2579 between transistors 2577 and 2575. Transistor 2577 has its source/drain path connected between $V_{DD}$ and node 2579. Transistor 2575 has its drain/source path connected between node 2579 and node 2573. Node 2573 is connected to pwell 2. Pwell 2 is connecting to the bulk of transistor 2581. When transmitter 2581 is off, node 2479 is at same voltage pwell 2 and makes the gate of transistor 2581 connect to pwell 1 (the gate and bulk of transistor 2581 are at the same voltage), then the drain of transistor 2581 can get 2 diode and 2Vt lower than the ground when there is common mode current with out turning the transistor 2581. If 2573 were connected to ground, the circuit can only get 2 diode and 1Vt lower than ground, which will limit the signal level at the receiver. A transistor 2571 has its drain/source path connected between node 2569 and ground. A resistor 2567 is connected between node 2565 and node 2569 and a resistor 2563 is connected between node 2569 and ground.

A transistor 2561 has its gate connected to receive the transmit enable signal and has its drain/source path connected between node 2512 and node 2565. A transistor 2559 has its drain/source path connected between node 2569 and ground. The gate of transistor 2559 is connected to node 2557. Node 2557 is also connected to the gate of a transistor 2555. The transistor 2555 has its drain/source path connected between node 2512 and ground. A transistor 2553 has its drain/source path connected between node 2557 and ground. The gate of transistor 2553 is connected to receive the transmit enable signal (tx_en). A transistor 2551 is also connected between node 2557 and ground. The gate of transistor 2551 is connected to receive the receive enable signal (rx_en). A pair of transistors 2549 and 2547 is connected between $V_{DD}$ and node 2557. Transistor 2549 has its source/drain path connected between the $V_{DD}$ node and node 2544. The gate of transistor 2549 is connected to receive the transmit enable signal. Transistor 2547 has its source/drain path connected between node 2545 and node 2557. The gate of transistor 2547 is connected to receive the receive enable signal.

When the transmitter is enabled and the transmit enable signal is at a logical "high" level and the receive enable signal is at a logical "low" level, the transmitter is enabled and the Pwell 1 node 2582 and the Pwell 2 node 2573 are tied to ground. This causes switch 2574 to be turned on. In the receive mode, switch 2574 is turned off and the Pwells are connected to the gate of transistor 2548. A two diode drop is allowed when the V+ node 2410 swings between above and below ground by a two diode voltage drop due to the symmetric structure of transistor 2474 and the surrounding circuit.

Figure 26:
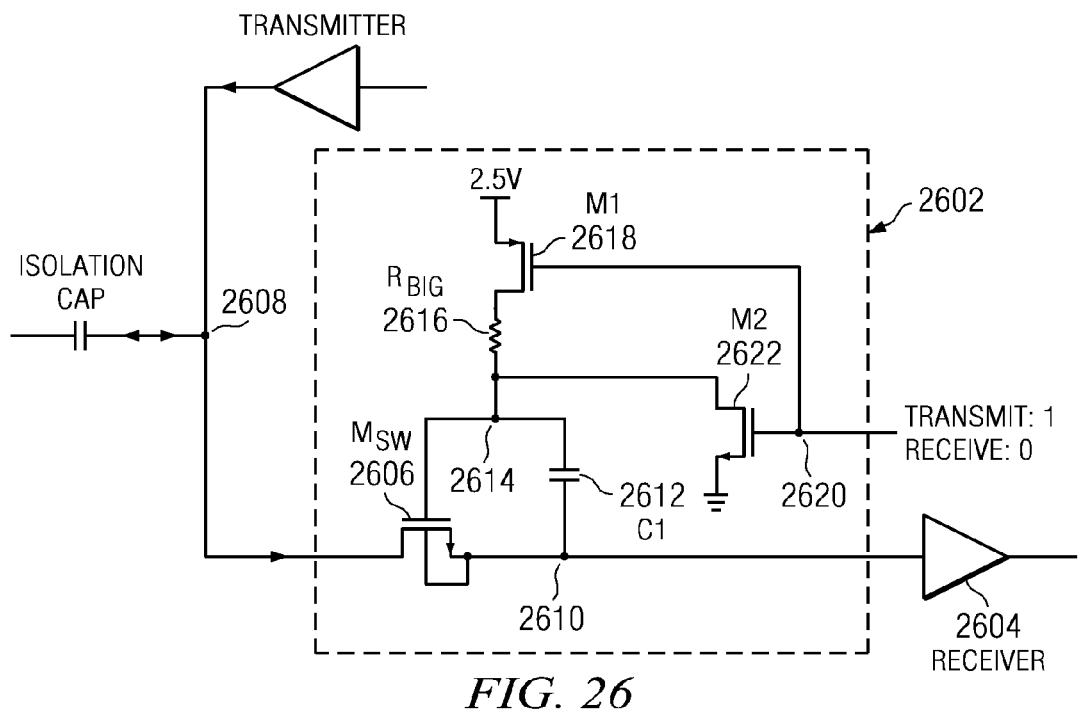
FIG. 26 illustrates the schematic diagram of the receiver side switch having a consistent on resistance.

Referring now to FIG. 26, there is illustrated the receiver side switch circuitry for connecting and disconnecting the differential receiver 2604. The receiver switch circuitry 2602 includes a transistor 2606 having its drain/source path connected between the input node 2608 and node 2610. A capacitor 2612 is connected between node 2614 and node 2610. The gate of transistor 2606 is connected to node 2614. A resistor 2616 is connected between the drain of transistor 2618 and node 2614. Transistor 2618 has its source/drain connection between the 2.5 volt voltage source and a resistor 2616. The gate of transistor 2618 is connected to the transmit receive enable node 2620. Transistor 2622 has its gate connected to node 2620 and its drain/source path connected between node 2614 and ground. Node 2620 receives the transmit or receive enable signal. A logical "1" level indicates the transmit mode while a logical "0" indicates the receive mode. The receiver 2604 may then be connected or disconnected by the transistor 2606. The gate voltage of transistor 2606 swings together with the source voltage of transistor 2606 when large transients appear at the input 2608. Thus, the gate to source voltage of the transistor switch 2606, and hence the on resistance are relatively constant and low during the occurrence of large common mode transients. The low and constant on resistance of the switch 2606 minimize the common mode to differential mode modulation. Otherwise, the common mode interference may modulate the difference mode signal and degrade the signal to noise ratio of the receiver 2604.

Figure 27:
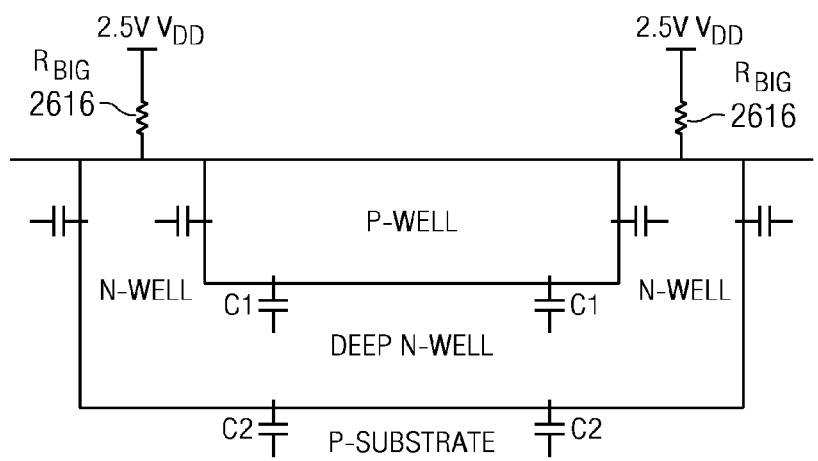
FIG. 27 illustrates the use of a resistor for reducing effective capacitance within a receiver side switch.

Referring now to FIG. 27, there is illustrated the manner in which the effective capacitance of the capacitor 2612 is significantly reduced by making the Nwell floating for high frequency AC signals. The first stage amplifier, as will be discussed herein below, demands a floating Pwell at the input terminal to improve common mode rejection. However, the pwell to deep Nwell capacitance is normally three times higher than the deep Nwell to P substrate capacitance. Conventional designs connect the deep Nwell to $V_{DD}$ directly which is usually an AC ground. Therefore, the input capacitance is large and reduces the high frequency signal. As illustrated in FIG. 27, by connecting the Nwell and deep Nwell to $V_{DD}$ directly through a large resistor 2616 the two capacitances are effectively in series for a high frequency AC signal and do not load the signal source.

Figure 28:
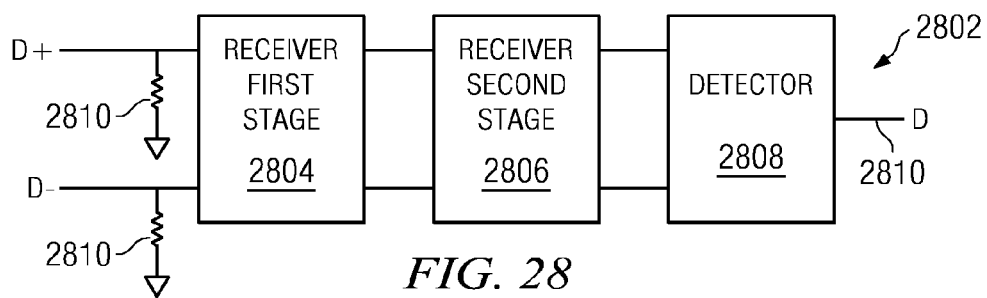
FIG. 28 is a functional block diagram of the receiver circuitry.

Referring now to FIG. 28, there is illustrated a functional block diagram of the differential receiver 2802. The differential receiver 2802 consists of a receiver first stage 2804 for providing an initial amplification of the differential signal received over the capacitive isolation link and a receiver second stage 2806 further amplifies the signal from the receiver first stage 2804. Finally, detector circuitry 2808 detects the data contained within the amplified receiver signal to output detected received data via node 2810. The input to the receiver first stage 2804 has switches associated therewith (not shown) that allow the receiver to be disconnected from the capacitive coupling when the associated side of the isolator is in the transmit mode. In the receive mode, however, the switches are closed such that the receiver first stage 2804 has differential inputs connected to the respective capacitors to receive data. This data is in the form of a pulse of RF energy or no energy, representing a respective logical "1" and a logical "0." Disposed on the two differential inputs are resistors 2810 that are disposed between the respective terminal and ground or some reference voltage. These resistors 2810 function to provide both a common mode voltage and to provide part of a high pass filter. The high pass filter functions to reject substantially all unwanted signals below the fundamental frequency of the oscillator. The value of the resistor 2810 is selected in conjunction with the capacitor to set this corner frequency. In addition, in conjunction with the receiver first stage 2804, the resistors 2810 will set the common mode voltage, as will be described herein below.

Figure 29:
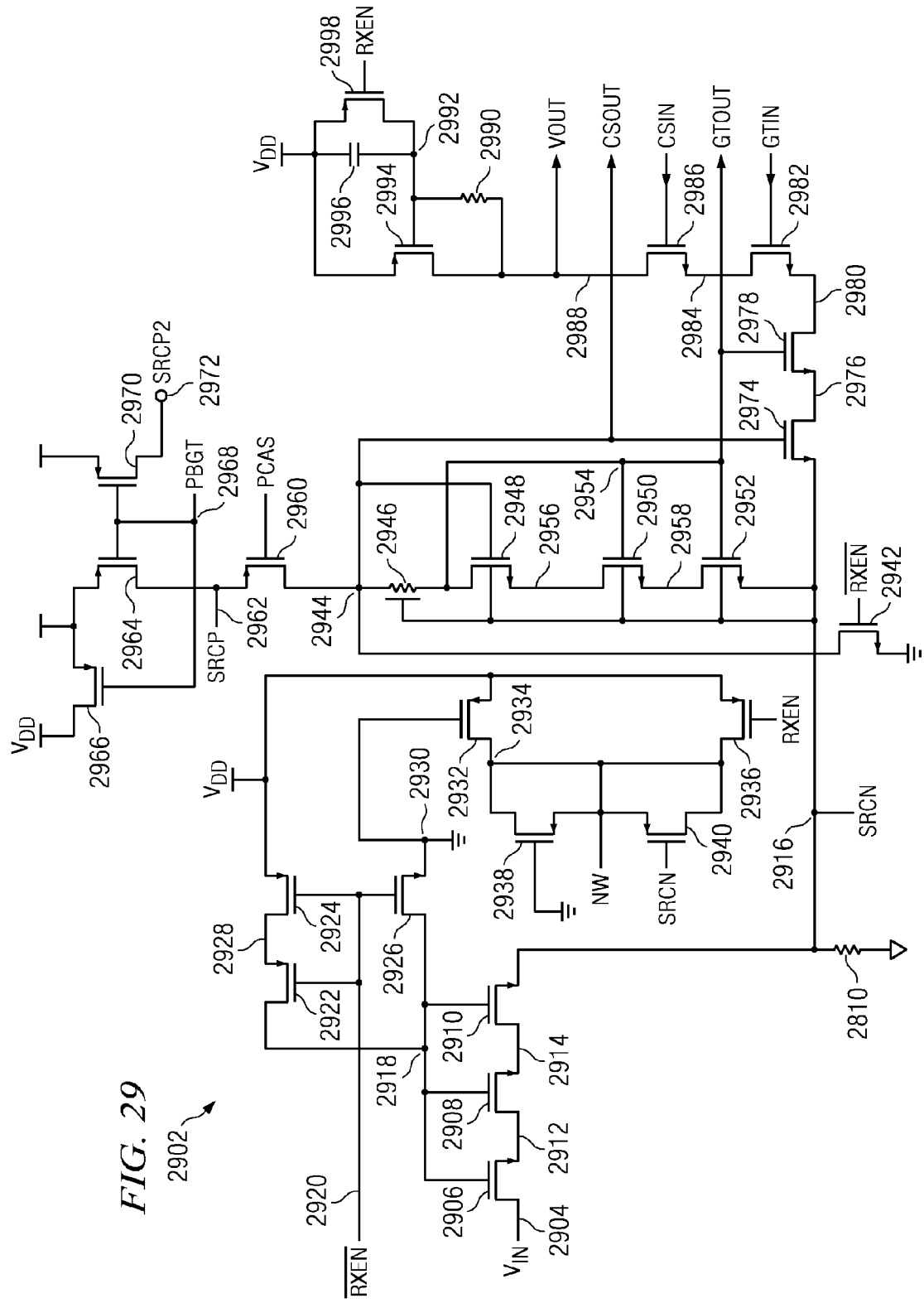
FIG. 29 is a schematic diagram of the stage one receiver circuitry.

Referring now to FIG. 29, there is illustrated a schematic diagram of the first stage receiver amplifier 2902. The schematic of FIG. 29 only illustrates the schematic for the circuitry on one phase of the differential receiver and it will be appreciated that the circuitry would be duplicated for the other phase of the differential receiver. The input signal for one phase received over the capacitive isolation link is input at node 2904. The signal will pass through a series of pass gate transistors consisting of transistor 2906, 2908 and 2910. Transistor 2906 has its drain/source path connected between node 2904 and node 2912. Transistor 2908 has its drain/source path connected between transistor 2912 and node 2914. Transistor 2910 has its drain/source path connected between node 2914 and node 2916. The resistor 2810 is connected between node 2916 and ground. The gates of transistors 2906, 2908 and 2910 are connected to node 2918. A receive enable signal ($\overline{rxen}$) is applied at node 2920 to the gates of transistors 2922, 2924 and 2926 to enable the first stage receiver amplifier. Transistor 2922 has its drain/source path connected between node 2918 and node 2928. Transistor 2924 has its drain/source path connected between node 2928 and $V_{DD}$. Transistor 2926 has its drain/source path connected between node 2918 and node 2930 and ground. Transistor 2932 has its source/drain path connected between the $V_{DD}$ node and node 2934. Transistor 2936 has its source/drain path connected between the $V_{DD}$ node and node 2934. The gate of transistor 2936 is connected to receive the receive enable signal (rxen). Transistor 2938 has its gate connected to ground and its drain and source are each connected to node 2934. Transistor 2940 has its gate connected to receive the SRCN signal from node 2916 and each of the source and drain connected to node 2934. Node 2934 is also connected to receive the NW signal. The NW signal is provided through an always on switch (look as a resistor) to $V_{DD}$. Thus, at high frequency the NW signal is floating and at low frequency the NW signal comprises $V_{DD}$.

Transistor 2942 has its gate connected to receive the $\overline{rxen}$ signal and its drain/source path between node 2944 and ground. Connected between node 2944 and the SRCN output node 2916 are a resistor 2946 and transistors 2948, 2950 and 2952. Resistor 2946 is connected between node 2944 and node 2954. Transistor 2948 has its drain/source path connected between node 2954 and node 2956. The gate of transistor 2948 is connected to node 2944. Transistor 2950 has its drain/source path connected between node 2956 and node 2958. The gate of transistor 2950 is connected to node 2954. Transistor 2952 has its drain/source path connected between node 2958 and node 2916. The gate of transistor 2952 is also connected to node 2954 (the gtout node). The gtout node is provided as the gtin signal to the first stage receiver circuitry of the other phase. The bulk of each of transistors 2948, 2950 and 2952 along with the bulk of resistor 2946 are also connected to node 2916. This ties them to the input signal and improves common mode rejection within the first stage receiver amplifier. Transistor 2960 has its source/drain path connected between node 2962 (the CRCP node) and node 2944. The gate of transistor 2960 is connected to the PCAS signal. Transistor 2964 is connected between $V_{DD}$ and node 2962. Transistors 2966, 2964, 2970 and 2960 comprise a current mirror. Transistor 2966 has its drain and source each connected to $V_{DD}$ and the gate is connected to the gate of transistor 2964 and transistor 2970 at node 2968. Transistor 2968 has its source/drain path connected between $V_{DD}$ and node 2972 the SRCP2 node.

Transistor 2974 has its source/drain path shorted and connected to node 2916. The gate of transistor 2974 is connected to node 2944 (csout node). The csout node provides the csin signal to the first stage receiver circuitry of the other phase. Transistor 2978 has its source/drain path shorted and connected to node 2916. The gate of transistor 2976 is connected to node 2954 (the gtout node). The transistors 2974 and 2978 are capacitors. Transistor 2982 has its drain/source path connected between node 2984 and node 2980. The gate of transistor 2982 is connected to the gtin node. Transistor 2986 has its drain/source path connected between node 2988 and node 2984 which is connected to gtout of the other phase. The gate of transistor 2986 is connected to the csin node which is connected to csout of the other phase. Node 2988 comprises the $V_{OUT}$ node wherein the amplified voltage received at node 2904 is provided. A resistor 2990 is connected between node 2992 and node 2988. A transistor 2994 has its source/drain path connected between $V_{DD}$ and node 2988. A capacitor 2996 is between $V_{DD}$ and node 2992. Transistor 2998 has its source/drain path connected between $V_{DD}$ and node 2992. The gate of transistor 2998 is connected to the receive enable signal (rxen). The gtout node for one branch of the first stage receiver provides its output to the gtin node of transistor 2982 on the other branch of the stage one receiver. The csout node 2944 is connected with the csin node to the gate of transistor 2986 on the other branch of the stage one differential receiver.

In operation, the circuit of FIG. 29 is a first stage amplifier that is a common gate amplifier. The signal $V_{IN}$ is received on the input terminal 2904 and is selectively switched to node 2916 through the transistors 2906, 2908 and 2910. When $R_{XEN}$ goes high, node 2920 is pulled low, turning on transistors 2922 and 2924. This pulls up node 2918, turning on transistors 2906-2914 and thus enabling the receiver. This then places the input signal $V_{IN}$ onto node 2916. Basically, the input signal will modulate this node which is disposed at a predetermined voltage, with the common mode voltage. This common mode voltage is set by a bias circuit comprised of the series connected in-channel transistors 2948-2952, transistor 2946 and transistor 2960. This is a current source. It is noted that the node 2944 provides a cascode bias output, csout, to the cascode transistor on the other phase, it being understood that this comprises one-half of the amplifier. The gates of transistors 2950 and 2952 are connected to the source/drain path of transistor 2946, i.e., they are essentially diode connected, and this provides the gate control signal for the gate transistor (corresponding to gate transistor 2982) in the other phase in a cross coupled manner. The gtin signal on the input of transistor 2982 comes from the source/drain transistor corresponding to transistor 2946. Similarly, the cascode transistor 2986 is controlled by the bias signal csout from the opposite phase. The two transistors 2974 and 2978, configured as capacitors, couple the input signal onto the cross-coupled gate for the other phase and also onto the csout signal, the cascode output. This configuration essentially provides a gm enhancement common gate amplifier. The opposite side of the bias string, the bias transistor 2970, is connected to the SRCP2 signal on the node corresponding to node 2962, in the other phase. Thus, there are provided two separate circuits similar to that of FIG. 29, one for $V_{IN}+$ and $V_{IN}-$.

The common mode voltage on node 2916 is provided by the bias circuitry. When no signal is present, the bias circuit will drive node 2916 to a level that is a predetermined number of threshold voltages below $V_{DD}$. The output on node 2988, which comprises the input to the second stage amplifier, has a common mode voltage that is set by resistor 2810 as the transistor 2994 is a diode connected transistor, such transistor 2998 is turned off when the receiver is enabled. The current will flow to transistor 2994 and through transistors 2986 and 2982, depending upon the bias thereto, it being noted that the difference between the voltage on the csout and gtout is set by transistor 2946, a resistive element. This therefore sets the current through that leg and transistor 2810. Therefore, the current going through the bias circuit and through the output leg defines the voltage on node 2916 and sets the voltage on node 2988, the common mode voltage. This is the voltage on the input transistors in the second stage.

Figure 30:
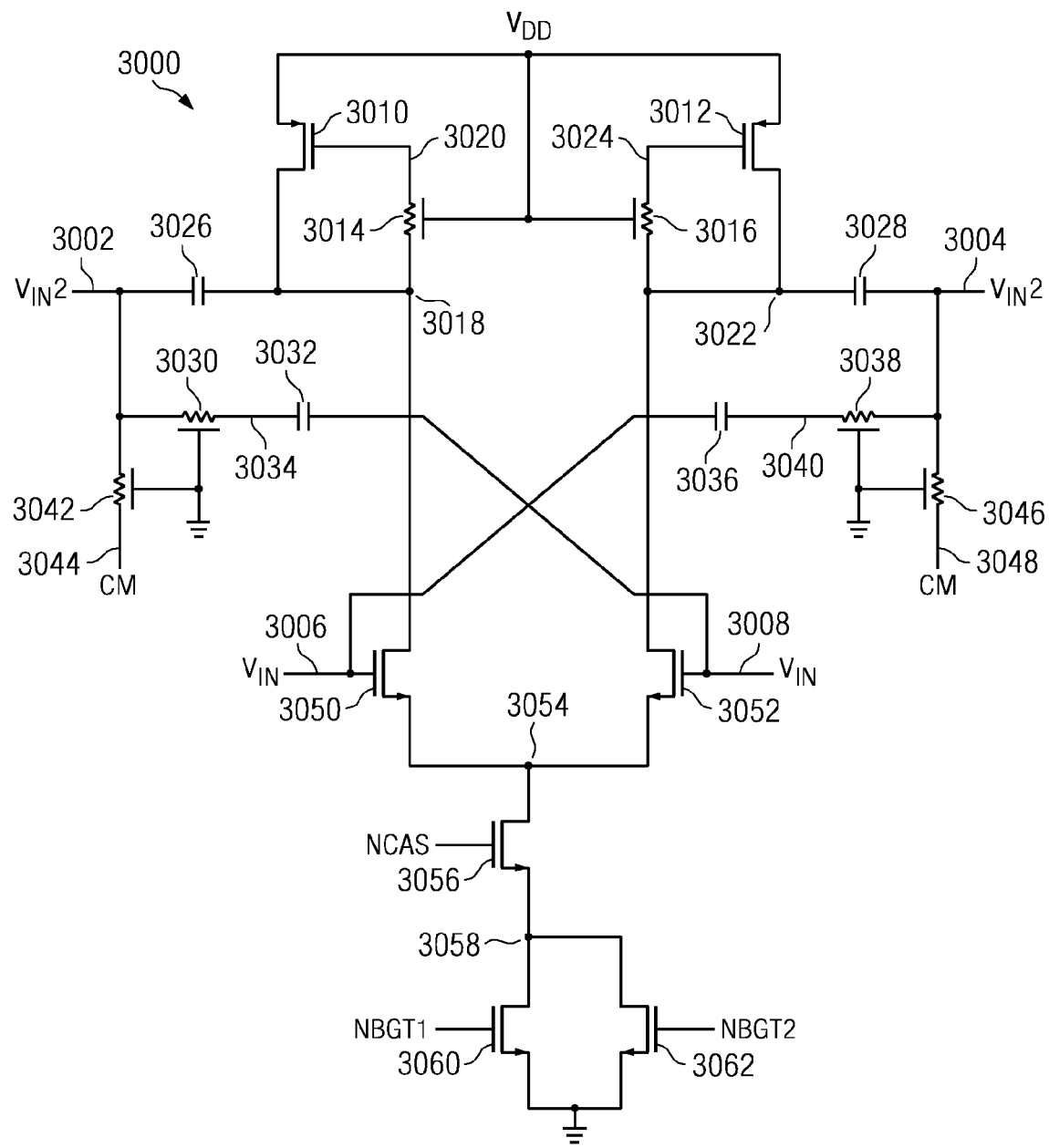
FIG. 30 is a schematic diagram of a stage two receiver circuitry.

Referring now to FIG. 30, there is illustrated the schematic diagram of the second stage receiver amplifier. Differential output voltages from a first phase branch of the first stage differential amplifier are provided at nodes 3002 and 3004. The differential output voltages from the first stage differential amplifier are applied to the second stage amplifier at nodes 3006 and 3008, respectively. A cascode amplifier circuit consists of transistor 3010, transistor 3012 and resistors 3014 and 3016. Transistor 3010 has its source/drain path connected between $V_{DD}$ and node 3018. Transistor 3010 has its gate connected to node 3020. Transistor 3012 has its source/drain path connected between $V_{DD}$ and node 3022. The gate of transistor 3012 is connected to node 3024. Resistor 3014 is connected between node 3020 and node 3018. Resistor 3016 is connected between node 3024 and node 3022. The bulk of each of resistors 3014 and 3016 are connected to $V_{DD}$. A capacitor 3026 is connected between node 3002 and node 3018. A capacitor 3028 is connected between node 3022 and node 3004. Input node 3008 is coupled to input node 3002 through a resistor 3030 and a capacitor 3032. Resistor 3030 is connected between node 3002 and node 3034. Capacitor 3032 is connected between node 3034 and node 3008.

Connected to input voltage node 3006 are a series connection of a capacitor 3036 and 3038. Capacitor 3036 is connected between node 3006 and node 3040. Resistor 3038 is connected between node 3040 and node 3004 to couple input signal from node 3006 to output node 3004. A resistor 3042 is connected between node 3002 and a common mode voltage to provide a common mode voltage to the respective input of the detector. Resistor 3046 is connected between node 3004 and node 3048 to the common mode voltage to provide a common mode voltage to the other input of the detector. Nodes 3006 and 3008 are connected to the gates of transistors 3050 and 3052 respectively. Transistor 3050 is connected between node 3018 and node 3054. Transistor 3052 has its drain/source path connected between node 3022 and node 3054. A transistor 3056 has its drain/source path connected between node 3054 and node 3058. The gate of transistor 3056 is connected to the NCAS signal node. Transistors 3060 and 3062 have their drain/source path connected in parallel between node 3058 and ground. The gate of transistor 3060 is connected to the NBTG1 signal node. The 3062 transistor has its gate connected to the NBG2 node. This is a common source differential amplifier.

The second stage amplifier of FIG. 30 uses a cascode differential amplifier 3000 to amplify differential mode signals and suppress common mode intereference/intermodulation. Moreover, common mode feed forward is employed to suppress common mode gain especially at high frequencies. Resistor 3030, 3038 and capacitors 3032 and 3036 attenuate the common mode interference leakage by more than 10 db. As noted herein above, the input voltage is set at a predetermined value, depending upon the common mode output voltage on node 2988 in the first stage amplifier associated with either side. It should be understood that there are two circuits similar to that of FIG. 29, one for each side of the detector input on node 3006 and 3008. This is biased such that the current through each of the transistors 3050 and 3052 are equal and at a set value, such that the voltages on nodes 3018 and 3022 are at an equal value. Since these are capacitively coupled to the detector through capacitors 3026 and 3028, no voltage will be passed therethrough. When the modulated voltage, i.e., the RF signal, is passed through due to a logic "1" data input, the RF value at 700 MHz will be disposed on the two inputs 3006 and 3008. This will then modulate nodes 3022 and 3018. This will be passed through the capacitors 3026 and 3028 to the detector. The common mode voltage for the detector is set on the outputs with the resistors 3130.

Figure 31:
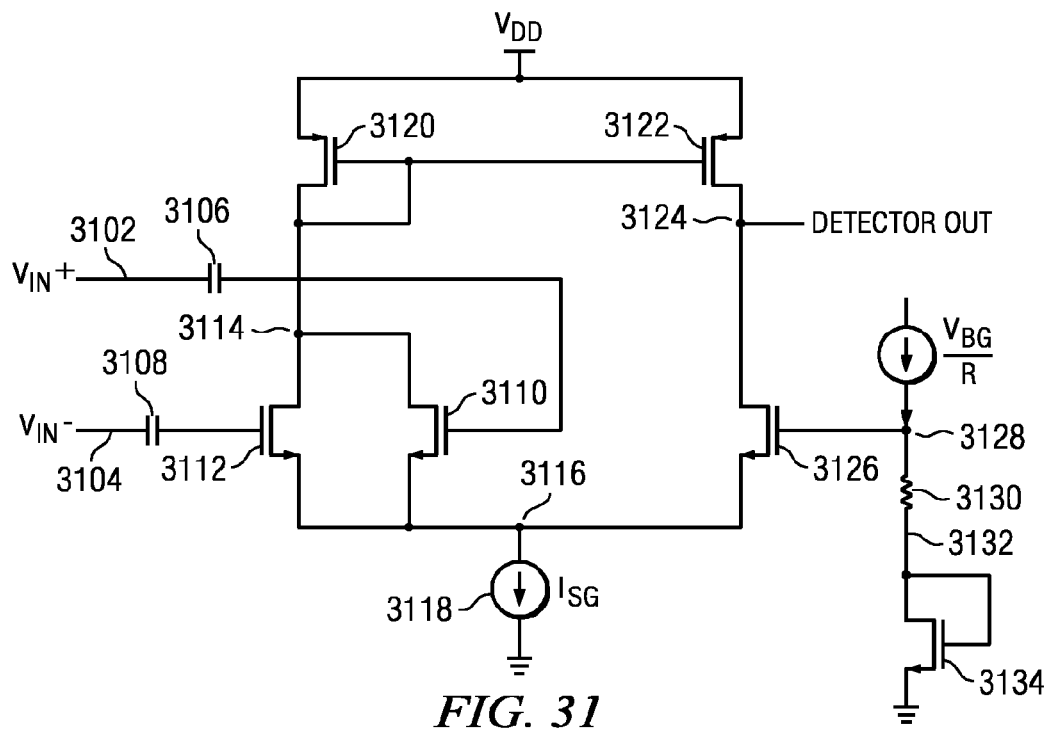
FIG. 31 is a schematic block diagram of the detector circuitry.

Referring now to FIG. 31, the output nodes 3044 and 3048 of the second stage amplifier of FIG. 30 provide an input to the detector circuit at node 3102 and 3104, respectively. The input signal is passed through capacitors 3106 and 3108 to the gates of transistors 3110 and 3112, respectively. Transistors 3112 and 3110 have their drain/source path connected between nodes 3114 and node 3116. A current source ISA 3118 is connected between node 3116 and ground. A transistor 3120 has its source/drain path connected between $V_{DD}$ and node 3114. The gate of transistor 3120 is also connected to its drain at node 3114. A transistor 3122 has its source/drain path connected between $V_{DD}$ and node 3124. The gate of transistor 3122 is also connected to node 3114 and the gate of transistor 3120. The node 3124 comprises the detector output node. A transistor 3126 has its drain/source path connected between node 3124 and node 3116. The gate of transistor 3126 is connected to receive a threshold level current at node 3128. A current derived from the bandgap voltage is applied to a resistor 3130 connected between node 3128 and node 3132. Transistor 3134 has its drain/source path connected between node 3132 and ground and the gate of transistor 3134 is connected to node 3132.

Figure 31A:
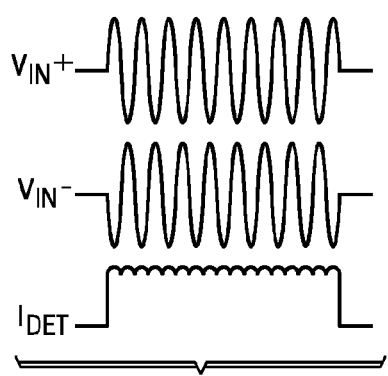
FIG. 31a is a waveform illustrating the operation of the circuit of FIG. 31.
Figure 31B:
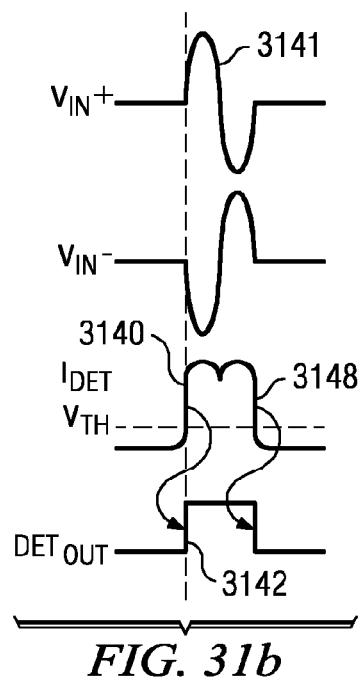
FIG. 31b is a second waveform illustrating the operation of the circuit of FIG. 31.

In operation, the detector of FIG. 31 is a full wave detector. The operation thereof can be seen with respect to the wave forms of FIGS. 31a and 31b. First, the capacitors 3106 and 3108 correspond to the capacitors 3026 and 3028 in FIG. 30. The common mode bias circuits associated with resistors 3142 and 3146 is not shown, but it should be understood that a common mode bias is applied to the gates of transistors 3112 and 3126. As such, $V_{IN}+$ and $V_{IN}-$ are disposed at a common mode voltage when there is no signal present. When a signal is present, these will be modulated. Therefore, there is a current that flows through transistors 3110 and 3112 and is summed at node 3116 in the non-signal mode. When the modulated signal is received, the current through one transistor 3112 or 3110 will increase, as seen by an edge 3140 in FIG. 31b. This current is the result of the rising portion of the sign wave at point 3141 associated with transistor 3110. Therefore, transistor 3110 will conduct current. This current will cause the voltage on node 3116 to increase. Once it increases past the threshold voltage on node 3128 minus 1 $V_t$, then the node 3124 will be pulled high, i.e., the detector output will indicate the presence of a logic "1." This will result in the output of the detector going high at a point 3141. The transistors 3112 and 3110 are fairly small transistors such that they are very fast. As such, it is possible for the detector to trigger on the edge of the first sign wave in the received RF signal. Therefore, when the input goes to a logic "1" and the oscillator signal is gated to the transmitter, it will be transmitted across the capacitive coupler and across a galvanically isolated barrier and when the signal rises above the threshold at point 3141, the detector will trigger. Similarly, when it falls below the threshold on a point 3148, the detector will fall.

This is due to the fact that there is a full wave rectifier configuration and very fast transitions on one side of the detector leg. It is also noted that the threshold 3128 could be varied with a programmable resistive element 3130 such that different thresholds could be utilized.

It will be appreciated by those skilled in the art having the benefit of this disclosure that this capacitive isolation circuit provides a that limits cross coupling and includes a receiver with improved data detection. It should be understood that the drawings and detailed description herein are to be regarded in an illustrative rather than a restrictive manner, and are not intended to be limiting to the particular forms and examples disclosed. On the contrary, included are any further modifications, changes, rearrangements, substitutions, alternatives, design choices, and embodiments apparent to those of ordinary skill in the art, without departing from the spirit and scope hereof, as defined by the following claims. Thus, it is intended that the following claims be interpreted to embrace all such further modifications, changes, rearrangements, substitutions, alternatives, design choices, and embodiments.

What is claimed is:

1. An integrated circuit having voltage isolation capabilities, comprising:
    a plurality of communications channels for transceiving data from the integrated circuit, each of the communications channel including capacitive isolation circuitry located in conductive layers of the integrated circuit for providing a high voltage isolation link, the capacitive isolation circuitry distributing a first portion of a high voltage isolation signal across a first group of capacitors on a first link and a second link in the capacitive isolation circuitry and distributing a second portion of the high voltage isolation signal across a second group of capacitors in the first link and the second link in the capacitive isolation circuitry;
    a differential receiver on each of the plurality of communications channels for receiving the data on the first link and the second link;
    a differential transmitter on each of the plurality of communications channels for transmitting the data on the first link at a selected one of a first phase and a second phase and for transmitting the data on the second link at the selected one of the first phase and the second phase, wherein the second phase is 180 degrees out of phase with the first phase; and
    wherein each of the differential transmitters controls the selection of the first phase and the second phase on each of the first link and the second link such that only the first phase or the second phase is cross coupled onto a selected communications channel from adjacent communications channels.

2. The integrated circuit of claim 1 further comprising a plurality of ground lines located between each pair of adjacent communications channels, wherein the ground lines prevent cross coupling between the adjacent communications channels.

3. The integrated circuit of claim 1, wherein the first link comprises a first pair of capacitors connected in series between two separate galvanically isolated areas and the second link comprises a second pair of capacitors connected in series between the two separate galvanically isolated areas.

4. The integrated circuit of claim 3, wherein each capacitor is paired with a resistor, the combination of the capacitor and the resistor forming a high pass filter for filtering unwanted signals caused by transients below a predetermined corner frequency.

5. The integrated circuit of claim 3, wherein each of the first link and the second link further includes a bond wire for interconnecting the pair of capacitors in the first link and the second link, the bond wire directly connected to a plate of each capacitor.

6. The integrated circuit of claim 3, wherein each of the first link and the second further comprises:
    a bond wire for interconnecting the pair of capacitors in the first link and the second link;
    a metal layer connection that is directly connected to the bond wire; and
    a plurality of conductive vias for interconnecting the metal layer connection with a plate of the capacitor.

7. The integrated circuit of claim 1, further including a switch for each of the differential receivers for selectively connecting the differential receiver to a selected one of the plurality of communications channels.

8. The integrated circuit of claim 1, wherein during a receive mode the differential transmitter is disabled and the differential receiver is enabled and during a transmit mode during a transmit mode the differential transmitter is enable and the differential receiver is disabled.

9. An integrated circuit having voltage isolation capabilities, comprising:
    a plurality of communications channels for transceiving data from the integrated circuit, each of the communications channel including capacitive isolation circuitry located in conductive layers of the integrated circuit for providing a high voltage isolation link, the capacitive isolation circuitry distributing a first portion of a high voltage isolation signal across a first group of capacitors on a first link and a second link in the capacitive isolation circuitry and distributing a second portion of the high voltage isolation signal across a second group of capacitors in the first link and the second link in the capacitive isolation circuitry;
    a differential receiver on each of the plurality of communications channels for receiving the data on the first link and the second link;
    a differential transmitter on each of the plurality of communications channels for transmitting the data on the first link at a first phase and for transmitting the data on the second link at a second phase, wherein the second phase is 180 degrees out of phase with the first phase; and
    a plurality of ground lines located between each pair of adjacent communications channels, wherein the ground lines prevent cross coupling between the adjacent communications channels.

10. The integrated circuit of claim 9, wherein the first link comprises a first pair of capacitors connected in series between two separate galvanically isolated areas and the second link comprises a second pair of capacitors connected in series between the two separate galvanically isolated areas.

11. The integrated circuit of claim 10, wherein each capacitor is paired with a resistor, the combination of the capacitor and the resistor forming a high pass filter for filtering unwanted signals caused by transients below a predetermined corner frequency.

12. The integrated circuit of claim 10, wherein each of the first link and the second link further includes a bond wire for interconnecting the pair of capacitors in the first link and the second link, the bond wire directly connected to a plate of each capacitor.

13. The integrated circuit of claim 10, wherein each of the first link and the second further comprises:
- a bond wire for interconnecting the pair of capacitors in the first link and the second link;
- a metal layer connection that is directly connected to the bond wire; and
- a plurality of conductive vias for interconnecting the metal layer connection with a plate of the capacitor.

14. The integrated circuit of claim 9, further including a switch for each of the differential receivers for selectively connecting the differential receiver to a selected one of the plurality of communications channels.

15. The integrated circuit of claim 9, wherein during a receive mode the differential transmitter is disabled and the differential receiver is enabled and during a transmit mode during a transmit mode the differential transmitter is enable and the differential receiver is disabled.

16. An integrated circuit having voltage isolation capabilities, comprising:
- a plurality of communications channels for transceiving data from the integrated circuit, each of the communications channel including capacitive isolation circuitry located in conductive layers of the integrated circuit for providing a high voltage isolation link, the capacitive isolation circuitry distributing a first portion of a high voltage isolation signal across a first group of capacitors on a first link and a second link in the capacitive isolation circuitry and distributing a second portion of the high voltage isolation signal across a second group of capacitors in the first link and the second link in the capacitive isolation circuitry;
- a differential receiver on each of the plurality of communications channels for receiving the data on the first link and the second link;
- a differential transmitter on each of the plurality of communications channels for transmitting the data on the first link at a selected one of a first phase and a second phase and for transmitting the data on the second link at the selected one of the first phase and the second phase, wherein the second phase is 180 degrees out of phase with the first phase;
- a plurality of ground lines located between each pair of adjacent communications channels, wherein the ground lines limit cross coupling between the adjacent communications channels;
- wherein each of the differential transmitters controls the selection of the first phase and the second phase on each of the first link and the second link such that the first phase or the second phase is cross coupled onto a selected communications channel from adjacent communications channels; and
- wherein each of the first link and the second link further includes a bond wire for interconnecting the pair of capacitors in the first link and the second link, the bond wire connected to a plate of each capacitor without a use of a bonding pad.

17. The integrated circuit of claim 16, wherein each of the first link and the second link further includes a bond wire for interconnecting the pair of capacitors in the first link and the second link, the bond wire directly connected to a plate of each capacitor.

18. The integrated circuit of claim 16, wherein each of the first link and the second further comprises:
- a bond wire for interconnecting the pair of capacitors in the first link and the second link;
- a metal layer connection that is directly connected to the bond wire; and
- a plurality of conductive vias for interconnecting the metal layer connection with a plate of the capacitor.

19. The integrated circuit of claim 16, wherein the first link comprises a first pair of capacitors connected in series between two separate galvanically isolated areas and the second link comprises a second pair of capacitors connected in series between the two separate galvanically isolated areas.

20. The integrated circuit of claim 19, wherein each capacitor is paired with a resistor, the combination of the capacitor and the resistor forming a high pass filter for filtering unwanted signals caused by transients below a predetermined corner frequency.

\* \* \* \* \*